US012658222B2

(12) United States Patent
Park et al.

(10) Patent No.: US 12,658,222 B2
(45) Date of Patent: Jun. 16, 2026

(54) MEMORY DEVICE AND OPERATING METHOD WITH TEMPERATURE COMPENSATION CIRCUIT

(71) Applicant: Samsung Electronics Co., Ltd., Suwon-si (KR)

(72) Inventors: Jihyun Park, Suwon-si (KR); Jungyu Lee, Suwon-si (KR); Yumin Kim, Suwon-si (KR); Chiweon Yoon, Suwon-si (KR); Eunchan Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 171 days.

(21) Appl. No.: 18/368,907

(22) Filed: Sep. 15, 2023

(65) Prior Publication Data

US 2024/0242743 A1 Jul. 18, 2024

(30) Foreign Application Priority Data

Jan. 18, 2023 (KR) ........................ 10-2023-0007461

(51) Int. Cl.
| | |
|---|---|
| *G11C 7/04* | (2006.01) |
| *G11C 7/08* | (2006.01) |
| *G11C 7/10* | (2006.01) |
| *G11C 7/14* | (2006.01) |

(52) U.S. Cl.
CPC .................. *G11C 7/04* (2013.01); *G11C 7/08* (2013.01); *G11C 7/1063* (2013.01); *G11C 7/14* (2013.01)

(58) Field of Classification Search
CPC ........... G11C 7/04; G11C 7/08; G11C 7/1063; G11C 7/14; G11C 7/1048; G11C 7/12; G11C 13/0033; G11C 13/004; G11C 16/0483; G11C 16/26; G11C 16/28; G11C 16/30; G11C 5/147; G11C 8/08; G05F 3/242; G05F 3/30
See application file for complete search history.

(56) References Cited

U.S. PATENT DOCUMENTS

| | | | |
|---|---|---|---|
| 7,197,421 B2 | 3/2007 | Pan | |
| 7,342,831 B2 * | 3/2008 | Mokhlesi | ............... G11C 16/12 365/185.23 |
| 7,399,116 B2 | 7/2008 | Takeuchi | |
| 8,147,131 B2 | 4/2012 | Goto et al. | |

(Continued)

FOREIGN PATENT DOCUMENTS

| | | | |
|---|---|---|---|
| CN | 104579349 B | * | 12/2017 |
| JP | 4799167 B2 | | 10/2011 |
| KR | 101575814 B1 | | 12/2015 |

*Primary Examiner* — Sultana Begum
(74) *Attorney, Agent, or Firm* — Muir Patent Law, PLLC

(57) ABSTRACT

A memory device includes a memory cell array including a plurality of memory cells connected to a plurality of word lines and a plurality of bit lines, a voltage generator configured to output a first voltage that varies according to temperature of the memory device, a second voltage that is constant regardless of the temperature, and a first reference voltage applied to at least one line among the plurality of word lines and the plurality of bit lines, and a temperature compensation circuit configured to generate a compensation offset voltage based on the first voltage and the second voltage, and output a second reference voltage based on the first reference voltage and the compensation offset voltage.

17 Claims, 14 Drawing Sheets

(56)     References Cited

U.S. PATENT DOCUMENTS

| | | | |
|---|---|---|---|
| 2002/0015317 A1* | 2/2002 | Umetsu | H02M 3/1584 |
| | | | 363/21.07 |
| 2006/0197581 A1 | 9/2006 | Chun et al. | |
| 2010/0237926 A1 | 9/2010 | Kikuta et al. | |
| 2020/0033384 A1* | 1/2020 | Kishi | G01R 15/207 |

\* cited by examiner

BLK1

BL1

BL2

BL3

DR

SSL
WL8
WL7
WL6
WL5
WL4
WL3
WL2
WL1
GSL
SUB

GE

CS
ST2

IL
ST1

CE

S
I
P

CSL

3rd
Direction

1st
Direction

2nd
Direction

FIG. 6

MEMORY DEVICE AND OPERATING METHOD WITH TEMPERATURE COMPENSATION CIRCUIT

CROSS-REFERENCE TO RELATED APPLICATION(S)

This application is based on and claims priority under 35 U.S.C. § 119 to Korean Patent Application No. 10-2023-0007461, filed on Jan. 18, 2023, in the Korean Intellectual Property Office, the disclosure of which is incorporated by reference herein in its entirety.

BACKGROUND

The inventive concept relates to a memory device, and more particularly, to a memory device in which levels of various types of reference voltages for performing program, read, and erase operations are efficiently adjusted, and an operating method of the memory device.

Semiconductor memory devices may include a plurality of memory cells storing data. In addition, semiconductor memory devices may be classified into volatile memory devices and nonvolatile memory devices according to whether stored data is lost when power supply thereto is interrupted. Memory cells included in a nonvolatile memory device may have different operating characteristics according to usage environments such as temperature and/or program/erase counts, and an operating voltage corresponding to a temperature change needs to be provided to the memory cells.

SUMMARY

The inventive concept provides a temperature compensation circuit that efficiently adjusts levels of various types of reference voltages for performing program, read, and erase operations.

According to example embodiments, a memory device may include a memory cell array including a plurality of memory cells connected to a plurality of word lines and a plurality of bit lines, a voltage generator configured to output a first voltage that varies according to temperature, a second voltage that is constant regardless of the temperature of the memory device, and a first reference voltage applied to at least one line among the plurality of word lines and the plurality of bit lines, and a temperature compensation circuit including at least one resistor and configured to generate a compensation offset voltage based on the first voltage and the second voltage, and output a second reference voltage based on the first reference voltage and the compensation offset voltage.

According to example embodiments, an operating method of a memory device including a plurality memory cells connected to a plurality of word lines and a plurality of bit lines may include generating a compensation offset voltage based on a first voltage that varies according to a change in temperature and a second voltage that does not vary according to a change in temperature, and generating a second reference voltage based on the compensation offset voltage and a first reference voltage applied to at least one line among the plurality of word lines and the plurality of bit lines.

According to example embodiments, a memory system may include a memory device including a plurality of memory cells connected to a plurality of word lines and a plurality of bit lines, and a memory controller configured to output a command to control the memory device. The memory device may further include a temperature compensation circuit configured to generate a compensation offset voltage according to a change in temperature of the memory device and adjust a level of a reference voltage applied to at least one line among the plurality of word lines and the plurality of bit lines, and the memory device may be configured to respond to the command to allow the temperature compensation circuit to generate the compensation offset voltage based on a first voltage that varies according to a change in temperature of the memory device and a second voltage that does not vary according to a change in temperature of the memory device, and to allow the temperature compensation circuit to generate a second reference voltage based on the compensation offset voltage and a first reference voltage applied to at least one line among the plurality of word lines and the plurality of bit lines.

BRIEF DESCRIPTION OF THE DRAWINGS

Embodiments will be more clearly understood from the following detailed description taken in conjunction with the accompanying drawings in which:

FIG. 6 is an equivalent circuit diagram of a first memory block according to an embodiment;

DETAILED DESCRIPTION OF THE EMBODIMENTS

Hereinafter, various example embodiments will be described in detail with reference to the accompanying drawings.

Figure 1:
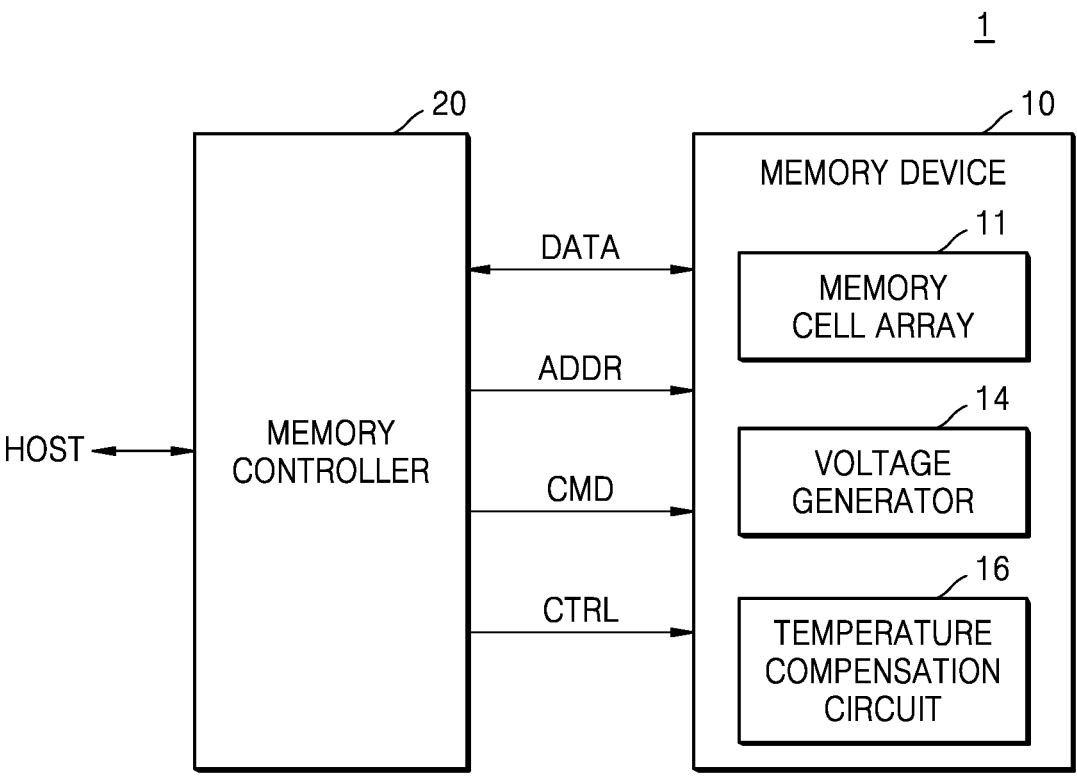
FIG. 1 is a block diagram of Ja memory system according to an embodiment.

FIG. 1 is a block diagram of a memory system 1 according to an embodiment.

Referring to FIG. 1, the memory system 1 may include a memory device 10 and a memory controller 20. The memory device 10 may include a memory cell array 11, a voltage generator 14, and a temperature compensation circuit 16.

In an embodiment, the memory system 1 may be implemented as an internal memory embedded in an electronic device, may be, for example, an embedded universal flash storage (UFS) memory device, an embedded multi-media card (eMMC), or a solid-state drive (SSD). In an embodiment, the memory system 1 may be implemented as an external memory detachable from an electronic device and may be, for example, a UFS memory card, a compact flash (CF) card, a secure digital (SD) card, a micro secure digital (Micro-SD) card, a mini secure digital (Mini-SD) card, an extreme digital (xD) card, or a memory stick.

The memory controller 20 may control the memory device 10 to read data stored in the memory device 10 or write data to the memory device 10 in response to a write/read request from a host HOST. Specifically, the memory controller 20 may control write, read, and erase operations on the memory device 10 by providing the memory device 10 with an address ADDR, a command CMD, and a control signal CTRL. In addition, data DATA to be written and data DATA to be read may be transmitted/received between the memory controller 20 and the memory device 10.

The memory cell array 11 may include a plurality of memory cells, and the memory controller 20 may perform write, read, and erase operations on each of the memory cells included in the memory device 10.

The memory device 10 may perform write, read, and erase operations on the memory cell by adjusting a reference voltage applied to each of a plurality of word lines and/or a plurality of bit lines connected to the plurality of memory cells via the voltage generator 14, and reference voltages required for performing write, read, and erase operations may each vary according to a change in temperature.

In this regard, the temperature compensation circuit 16 may adjust a reference voltage required for performing write, read, and erase operations on the memory cell via a compensation offset voltage according to a change in temperature. Accordingly, the memory device 10 may perform write, read, and erase operations on each of the memory cells via reference voltages reflecting a change in temperature. A method, performed by the temperature compensation circuit 16, of outputting a reference voltage reflecting a compensation offset voltage according to a change in temperature is described in detail with reference to other drawings.

Figure 2:
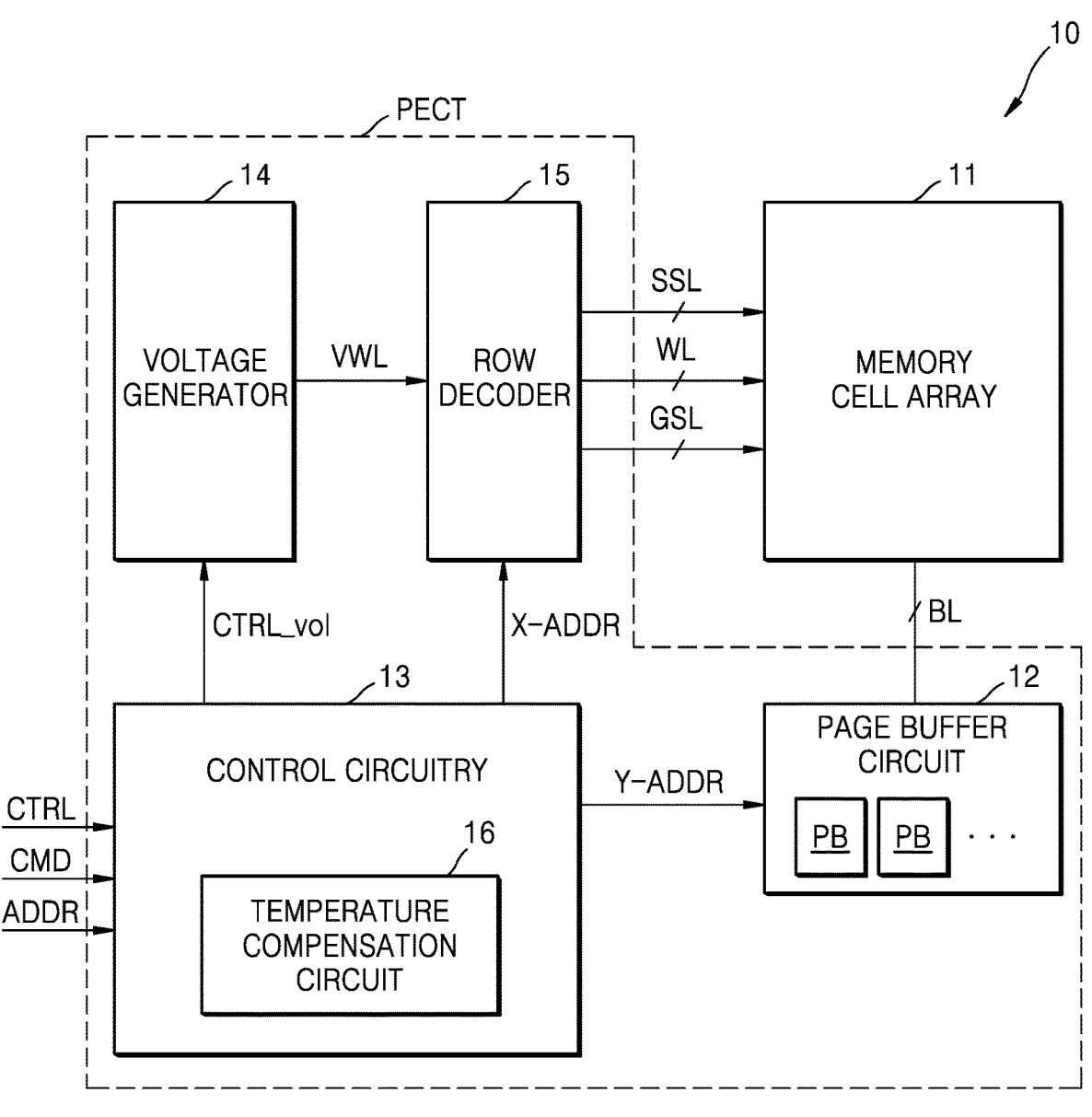
FIG. 2 is a block diagram of a memory device according to an embodiment.

FIG. 2 is a block diagram of the memory device 10 according to an embodiment.

Referring to FIG. 2, the memory device 10 may include the memory cell array 11 and a peripheral circuit PECT, and the peripheral circuit PECT may include a page buffer circuit 12, a control circuitry 13, the voltage generator 14, a row decoder 15, and the temperature compensation circuit 16. Although not shown in FIG. 2, the peripheral circuit PECT may further include a data input/output circuit or an input/output interface.

The memory cell array 11 may be connected to the page buffer circuit 12 via bit lines BL and may be connected to the row decoder 15 via word lines WL, string select lines SSL, and ground select lines GSL.

The memory cell array 11 may include a plurality of memory cells and may be connected to the word lines WL, the string select lines SSL, the ground select lines GSL, and the bit lines BL. The memory cell array 11 may be connected to the row decoder 15 via the word lines WL, the string select lines SSL, and the ground select lines GSL and may be connected to the page buffer circuit 12 via the bit lines BL.

For example, the plurality of memory cells included in the memory cell array 11 may be nonvolatile memory cells that retain stored data even when power supplied to the memory cells is cut off. Specifically, when the memory cells are nonvolatile memory cells, the memory device 10 may be electrically erasable programmable read-only memory (EE-PROM), flash memory, phase change random access memory (PRAM), resistance random access memory (RRAM), nano-floating gate memory (NFGM), polymer random access memory (PoRAM), magnetic random access memory (MRAM), or ferroelectric random access memory (FRAM). Hereinafter, embodiments are described assuming that the plurality of memory cells are NAND flash memory cells, but it will be understood that the inventive concept is not limited thereto.

The memory cell array 11 may include a plurality of memory blocks, and each of the memory blocks may have a planar structure or a three-dimensional structure. The memory cell array 11 may include at least one of a single-level cell block including single-level cells (SLCs), a multi-level cell block including multi-level cells (MLCs), a triple-level cell block including triple-level cells (TLCs), and a quad-level cell block including quad-level cells (QLCs). For example, some memory blocks of the plurality of memory blocks may be single-level cell blocks, and other memory blocks may be multi-level cell blocks, triple-level cell blocks, or quad-level cell blocks.

In an embodiment, the memory cell array 11 may include a three-dimensional memory cell array, the three-dimensional memory cell array may include a plurality of NAND strings, and each of the NAND strings may include memory cells respectively connected to word lines vertically stacked on a substrate. However, the inventive concept is not limited thereto, and in some embodiments, the memory cell array 11 may include a two-dimensional memory cell array.

The page buffer circuit 12 may operate in response to control by the control circuitry 13. For example, the page buffer circuit 12 may operate as a write driver or a sense amplifier. In an embodiment, during a program operation, the page buffer circuit 12 may operate as a write driver to apply, to the bit lines BL, a voltage according to the data DATA to be stored in the memory cell array 11. In an embodiment, during a read operation, the page buffer circuit 12 may operate as a sense amplifier to sense the data DATA stored in the memory cell array 11.

The page buffer circuit 12 may select some of the bit lines BL in response to a column address Y-ADDR. Specifically, the page buffer circuit 12 may operate as a write driver or a sense amplifier according to an operation mode.

The control circuitry 13 may output various internal control signals for programming (writing) data to the memory cell array 11 or reading data from the memory cell array 11 based on the command CMD, the address ADDR, and the control signal CTRL. For example, the control circuitry 13 may output a voltage control signal CTRL_vol for controlling the level of various voltages generated from the voltage generator 14. For example, the control circuitry 13 may output the voltage control signal CTRL_vol such that the voltage generator 14 generates a reference voltage determined according to a change in temperature. Alternatively, the control circuitry 13 may output the voltage control signal CTRL_vol such that the temperature compensation circuit 16 receives an input of a reference voltage and outputs a reference voltage in which a change in temperature is reflected.

The control circuitry 13 may provide a row address X-ADDR to the row decoder 15 and may provide the column address Y-ADDR to the page buffer circuit 12.

The voltage generator 14 may generate various types of voltages for performing program, read, and erase operations on the memory cell array 11, based on the voltage control signal CTRL_vol. Specifically, the voltage generator 14 may generate a word line voltage VWL, for example, a program voltage, a read voltage, a pass voltage, an erase verify voltage, or a program verify voltage and may further generate a string select line voltage and a ground select line voltage.

The row decoder 15 may select one of a plurality of memory blocks in response to the row address X-ADDR, may select one of the word lines WL of the selected memory block, and may select one of the string select lines SSL.

Referring to FIG. 2, the control circuitry 13 may include the temperature compensation circuit 16. However, embodiments are not limited thereto, and the temperature compensation circuit 16 may be arranged outside the control circuitry 13. In an embodiment, the temperature compensation circuit 16 may be included in the voltage generator 14.

The temperature compensation circuit 16 may adjust a reference voltage used for performing write, read, and erase operations on the memory cell via a compensation offset voltage according to a change in temperature.

In embodiments, the temperature compensation circuit 16 may generate a compensation offset voltage according to a change in temperature and may output a reference voltage reflecting the generated compensation offset voltage.

For example, the voltage generator 14 may generate various types of reference voltages for performing program, read, and erase operations on the memory cell array 11, based on the voltage control signal CTRL_vol. The temperature compensation circuit 16 may receive an input of a generated reference voltage and output a reference voltage in which a change in temperature is reflected.

In other words, the temperature compensation circuit 16 may generate a compensation offset voltage according to a change in temperature and may output a reference voltage reflecting the generated compensation offset voltage. A method, performed by the temperature compensation circuit 16, of generating a compensation offset voltage according to a change in temperature and outputting a reference voltage reflecting the generated compensation offset voltage is described in detail with reference to other drawings.

In embodiments, the temperature compensation circuit 16 may determine a compensation offset voltage according to a change in temperature and may determine a reference voltage reflecting the generated compensation offset voltage. The control circuitry 13 may output the voltage control signal CTRL_vol such that the voltage generator 14 generates the reference voltage determined according to the change in temperature. Accordingly, the voltage generator 14 may generate various types of voltages, in which a change in temperature is reflected, for performing program, read, and erase operations on the memory cell array 11, based on the voltage control signal CTRL_vol.

In other words, the temperature compensation circuit 16 may determine a compensation offset voltage according to a change in temperature, and the control circuitry 13 may output the voltage control signal CTRL_vol such that the voltage generator 14 generates a reference voltage reflecting the determined compensation offset voltage.

Each of the memory cells included in the memory cell array 11 may store data of 2 bits or more. For example, the memory cell may be an MLC that stores 2-bit data. As another example, the memory cell may be a TLC that stores 3-bit data or a QLC that stores 4-bit data. However, the inventive concept is not limited thereto, and in some embodiments, some of the memory cells included in the memory cell array 11 may be SLCs that store 1-bit data, and other memory cells other than some of the memory cells may be MLCs.

Figure 3:
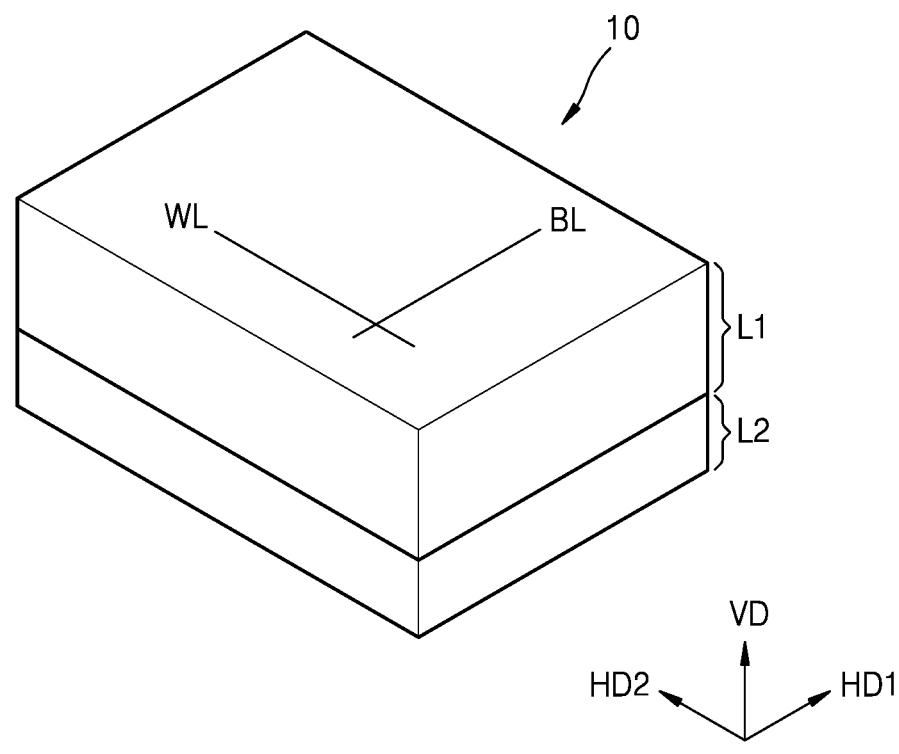
FIG. 3 is a schematic view of a structure of the memory device of FIG. 2 according to an embodiment.

FIG. 3 is a schematic view of a structure of the memory device 10 of FIG. 2 according to an embodiment.

Referring to FIG. 3, the memory device 10 may include a first semiconductor layer L1 and a second semiconductor layer L2, and the first semiconductor layer L1 may be stacked in a vertical direction VD with respect to the second semiconductor layer L2. Specifically, the second semiconductor layer L2 may be arranged under the first semiconductor layer L1 in the vertical direction VD, and accordingly, the second semiconductor layer L2 may be arranged close to a substrate. In an embodiment, the memory cell array 11 of FIG. 2 may be formed in the first semiconductor layer L1, and the peripheral circuit PECT of FIG. 2 may be formed in the second semiconductor layer L2. Accordingly, the memory device 10 may have a structure in which the memory cell array 11 is arranged over the peripheral circuit PECT, that is, a cell over periphery (COP) structure. The COP structure may effectively reduce a horizontal area of the memory device 10, and may improve the degree of integration of the memory device 10.

In an embodiment, the second semiconductor layer L2 may include a substrate, and the peripheral circuit PECT may be formed in the second semiconductor layer L2 by forming, on the substrate, transistors and metal patterns for wiring the transistors. After the peripheral circuit PECT is formed in the second semiconductor layer L2, the first semiconductor layer L1 including the memory cell array 11 may be formed, and metal patterns for electrically connecting the word lines WL and the bit lines BL of the memory cell array 11 to the peripheral circuit PECT formed in the second semiconductor layer L2 may be formed. For example, the bit lines BL may extend in a first horizontal direction HD1, and the word lines WL may extend in a second horizontal direction HD2.

With the development of semiconductor processes, as the number of stages of memory cells arranged in the memory cell array 11 increases, in other words, as the number of stacked word lines WL increases, the area of the memory cell array 11 may decrease, and accordingly, the area of the peripheral circuit PECT may also decrease. According to the present embodiment, the page buffer circuit 12 may have a structure in which a page buffer unit and a cache latch are separated, in order to reduce the area of a region occupied by the page buffer circuit 12.

Figure 4:
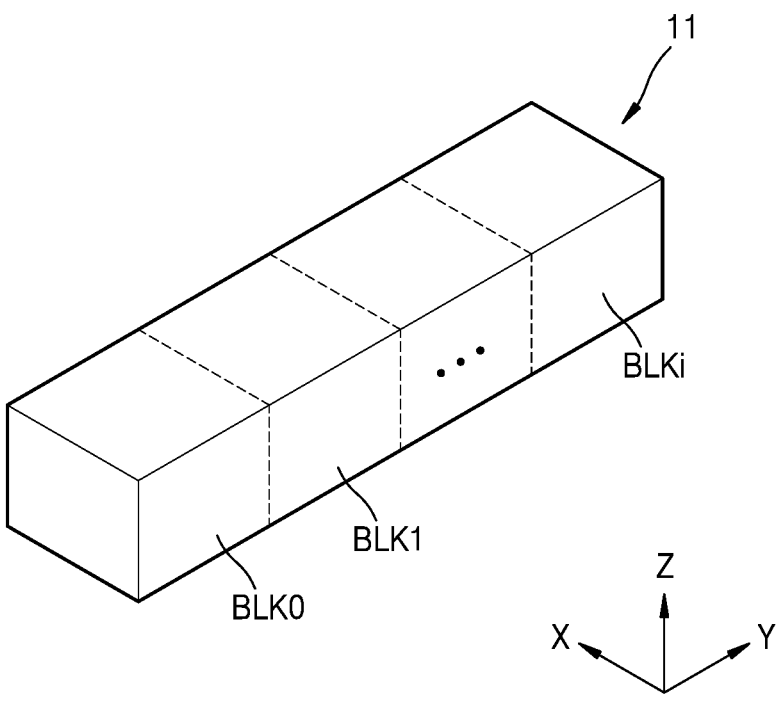
FIG. 4 is a diagram of a memory cell array of FIG. 2 according to an embodiment.

FIG. 4 is a diagram of the memory cell array 11 of FIG. 2 according to an embodiment.

Referring to FIG. 4, the memory cell array 11 may include zeroth to ith memory blocks BLK0 to BLKi (wherein i is a positive integer), and each of the zeroth to ith memory blocks BLK0 to BLKi may have a three-dimensional structure (or a vertical structure). Each of the zeroth to ith memory blocks BLK0 to BLKi may include a plurality of NAND strings extending in the vertical direction VD. The zeroth to ith memory blocks BLK0 to BLKi may be selected by the row decoder (15 of FIG. 2).

Figure 5:
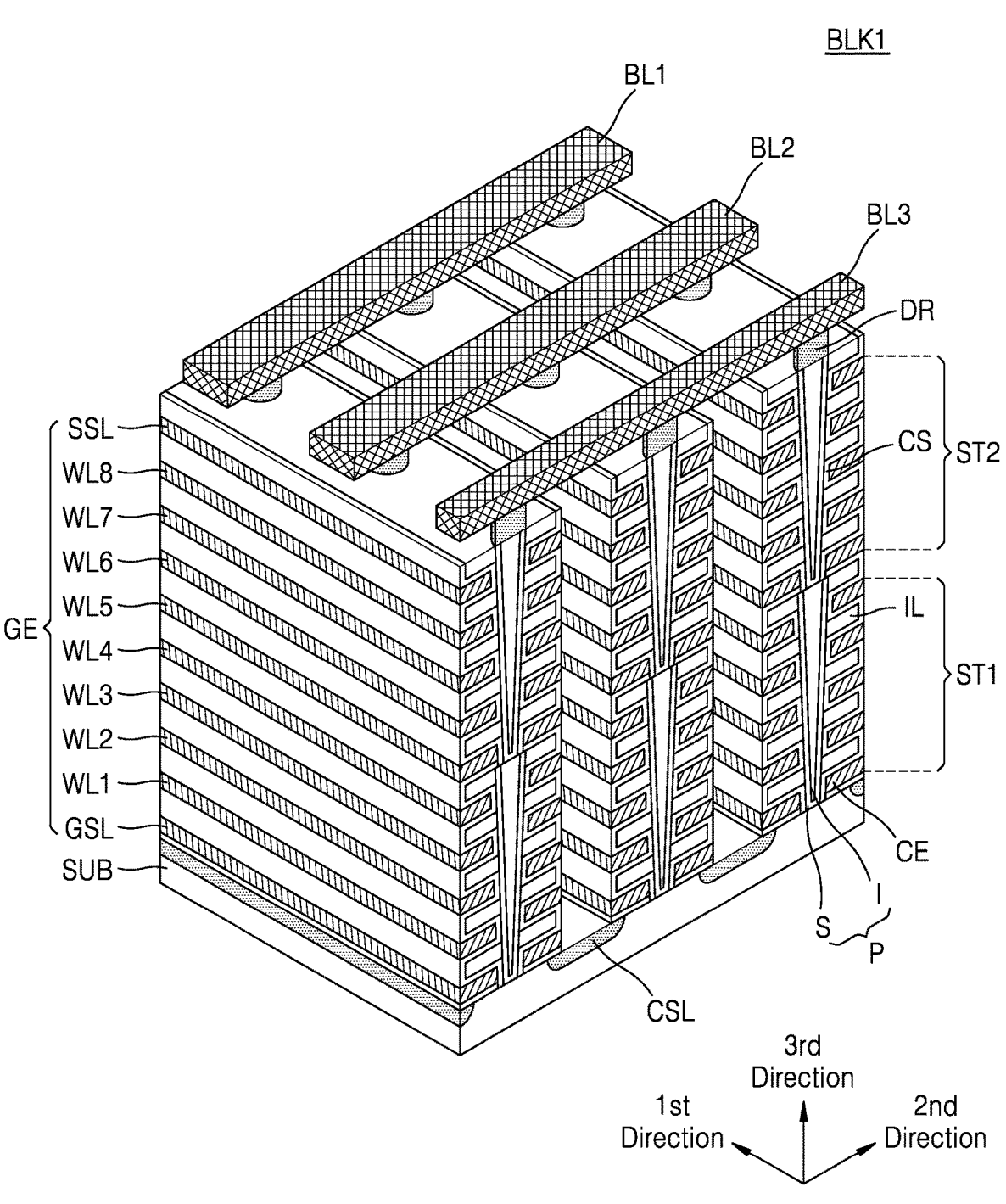
FIG. 5 is a perspective view of a first memory block according to an embodiment.

FIG. 5 is a perspective view of a first memory block BLK1 according to an embodiment.

Referring to FIG. 5, each of memory blocks included in a memory cell array (for example, 11 of FIG. 2) may be formed in the vertical direction with respect to a substrate SUB. Referring to FIG. 5, for example, the first memory block BLK1 may be formed in a third direction ("3rd Direction" of FIG. 5) with respect to the substrate SUB. FIG. 5 illustrates that the memory block includes two select lines, namely, a ground select line GSL and a string select line SSL, eight word lines, namely, first to eighth word lines WL1 to WL8, and three bit lines, namely, first to third bit lines BL1 to BL3, but in practice, may include more or fewer lines.

The substrate SUB has a first conductive type (for example, p-type), and a common source line CSL extending in a first direction and doped with impurities having a second conductive type (for example, n-type) is provided on the substrate SUB. The substrate SUB may be a bulk silicon substrate, a silicon-on-insulator (SOI) substrate, a germanium substrate, a germanium-on-insulator (GOI) substrate, a silicon-germanium substrate, or a substrate of an epitaxial thin-film obtained by performing selective epitaxial growth (SEG). The substrate SUB may include or be formed of a semiconductor material and may include, for example, at least one of silicon (Si), germanium (Ge), silicon germanium (SiGe), gallium arsenide (GaAs), indium gallium arsenide (InGaAs), aluminum gallium arsenide (AlGaAs), and a mixture thereof.

A first memory stack ST1 may be provided on the substrate SUB. Specifically, a plurality of insulating films IL extending in the first direction are sequentially provided on a region of the substrate SUB, the region being between two adjacent common source lines CSL in the third direction, and the plurality of insulating films IL are apart from each other by a specific distance in the third direction. For example, the plurality of insulating films IL may include an insulating material such as silicon oxide. A plurality of pillars P arranged sequentially in the first direction and passing through the plurality of insulating films IL in the third direction according to etching are provided on a region of the substrate SUB, the region being between two adjacent common source lines CSL. For example, the plurality of pillars P may be in contact with the substrate SUB through the plurality of insulating films IL. Specifically, a surface layer S of each of the pillars P may include a silicon material having a first type and may function as a channel region. An inner layer I of each of the pillars P may include an insulating material such as silicon oxide, or an air gap.

A charge storage layer CS is provided along the insulating films IL, the pillars P, and an exposed surface of the substrate SUB, in a region between two adjacent common source lines CSL. The charge storage layer CS may include a gate insulating layer (or referred to as a "tunneling insulating layer"), a charge trap layer, and a blocking insulating layer. For example, the charge storage layer CS may have an oxide-nitride-oxide (ONO) structure. In addition, a gate electrode GE such as select lines, namely, the ground select lines GSL and the string select lines SSL, and word lines, namely, the first to eighth word lines WL1 to WL8, is provided on an exposed surface of the charge storage layer CS, in a region between two adjacent common source lines CSL.

The first memory block BLK1 according to the inventive concept may further include a second memory stack ST2 formed, on the first memory stack ST1 formed by the above-described method, by the same method. Drains or drain contacts DR are respectively provided on the plurality of pillars P extending up to the second memory stack ST2. For example, the drains or drain contacts DR may include or be formed of a silicon material doped with impurities having a second conductive type. Bit lines, namely, the first to third bit lines BL1 to BL3, extending in a second direction and arranged apart by a specific distance in the first direction are provided on the drains or drain contacts DR.

Figure 6:
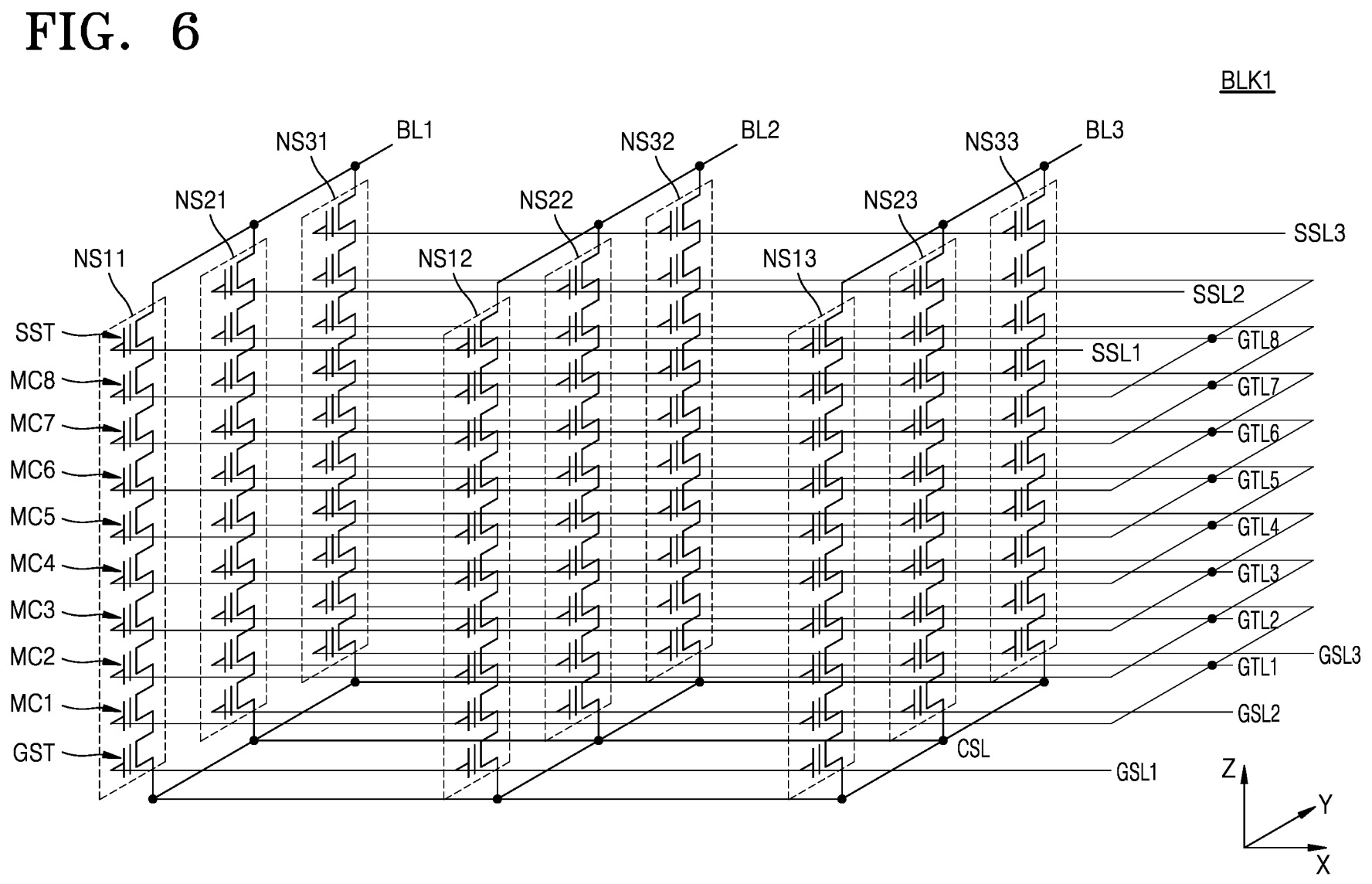

FIG. 6 is an equivalent circuit diagram of the first memory block BLK1 according to an embodiment.

Referring to FIG. 6, the first memory block BLK1 may be a NAND flash memory having a vertical structure, and each of memory blocks, namely, first to zth memory blocks BLK1 to BLKz, included in the memory cell array (for example, 11 of FIG. 2) shown in FIG. 2 may be implemented as shown in FIG. 6. The first memory block BLK1 may include a plurality of NAND cell strings NS11, NS21, NS31, NS12, NS22, NS32, NS13, NS23, and NS33, a plurality of word lines, namely, the first to eighth word lines WL1 to WL8, a plurality of bit lines, namely, the first to third bit lines BL1 to BL3, a plurality of ground select lines, namely, first to third ground select lines GSL1 to GSL3, a plurality of string select lines, namely, first to third string select lines SSL1 to SSL3, and the common source line CSL. In this regard, the number of NAND cell strings, the number of word lines, the number of bit lines, the number of ground select lines, and the number of string select lines may vary according to an embodiment.

The NAND cell strings NS11, NS21, and NS31 are provided between the first bit line BL1 and the common source line CSL, the NAND cell strings NS12, NS22, and NS32 are provided between the second bit line BL2 and the common source line CSL, and the NAND cell strings NS13, NS23, and NS33 are provided between the third bit line BL3 and the common source line CSL. Each of the NAND cell strings (for example, NS11) may include a string select transistor SST, a plurality of memory cells MC1 to MC8, and a ground select transistor GST, which are connected in series.

NAND cell strings commonly connected to one bit line may form one column. For example, the NAND cell strings NS11, NS21, and NS31 commonly connected to the first bit line BL1 may correspond to a first column, the NAND cell strings NS12, NS22, and NS32 commonly connected to the second bit line BL2 may correspond to a second column, and the NAND cell strings NS13, NS23, and NS33 commonly connected to the third bit line BL3 may correspond to a third column.

NAND cell strings connected to one string select line may form one row. For example, the NAND cell strings NS11, NS12, and NS13 connected to the first string select line SSL1 may correspond to a first row, the NAND cell strings NS21, NS22, and NS23 connected to the second string select line SSL2 may correspond to a second row, and the NAND cell strings NS31, NS32, and NS33 connected to the third string select line SSL3 may correspond to a third row.

The string select transistor SST may be connected to corresponding first to third string select lines SSL1 to SSL3. The plurality of memory cells MC1 to MC8 may be respectively connected to corresponding first to eighth word lines WL1 to WL8. The ground select transistor GST may be connected to corresponding ground select lines GSL1 to GSL3, and the string select transistor SST may be connected to corresponding first to third bit lines BL1 to BL3. The ground select transistor GST may be connected to the common source line CSL.

In the present embodiment, a word line (for example, WL1) of the same height is commonly connected, the first to third string select lines SSL1 to SSL3 are separated from each other, and the ground select lines GSL1 to GSL3 are also separated from each other. For example, when memory cells connected to the first word line WL1 and included in the NAND cell strings NS11, NS12, and NS13 corresponding to the first column are programmed, the first word line WL1 and the first string select line SSL1 are selected. However, the inventive concept is not limited thereto, and in some embodiments, the ground select lines GSL1 to GSL3 may be commonly connected.

Figure 7:
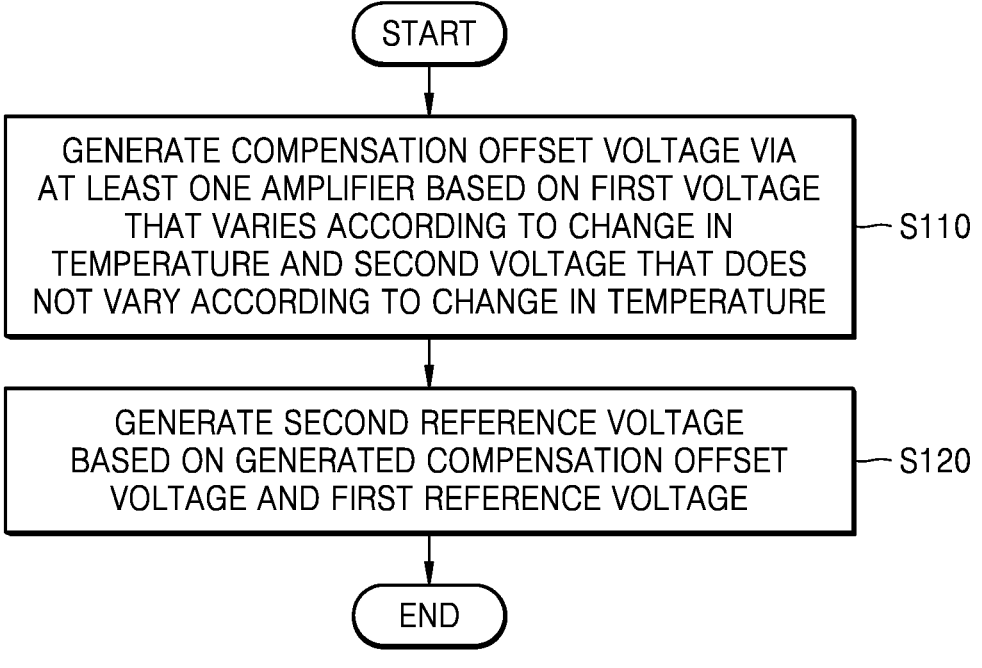
FIG. 7 is a flowchart of an operating method of a memory device, according to an embodiment.
Figure 8:
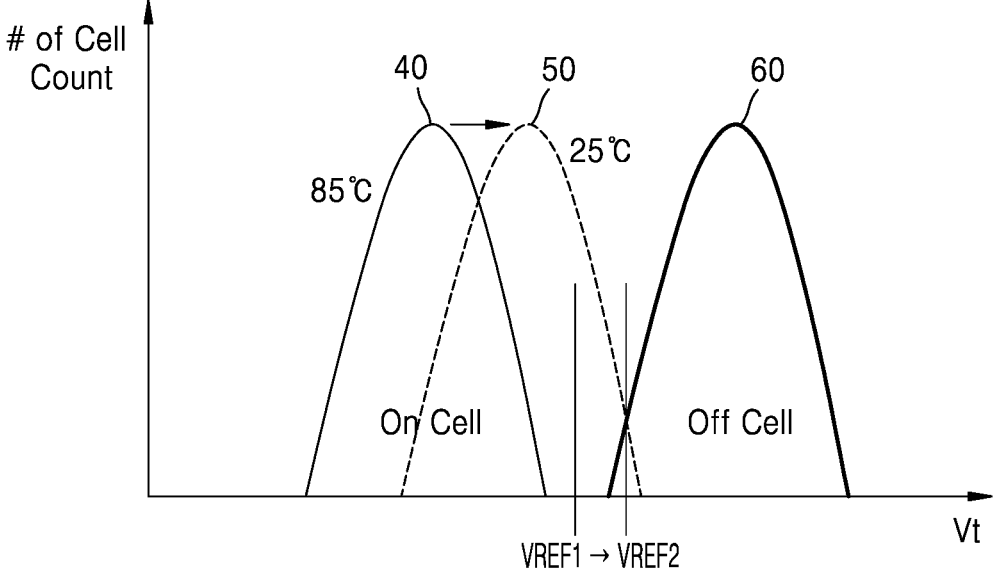
FIG. 8 is a diagram for explaining an operating method of a memory device, according to an embodiment.

FIG. 7 is a flowchart showing an operating method of the memory device 10, according to an embodiment, and FIG. 8 is a diagram for explaining an operating method of the memory device 10, according to an embodiment.

First, the reason that the memory device 10 adjusts a reference voltage required for performing write, read, and erase operations on a memory cell according to a change in temperature is described with reference to FIG. 8.

Referring to FIG. 8, a memory cell distribution according to different temperatures is shown. The memory cell distribution according to the inventive concept may refer to a distribution of threshold voltages of memory cells. A memory cell distribution 40 may be a distribution of threshold voltages of memory cells that become on-cells based on a first reference voltage VREF1 at 85° C. A memory cell distribution 60 may be a distribution of threshold voltages of memory cells that become off-cells based on the first reference voltage VREF1 or a second reference voltage VREF2. The first reference voltage VREF1 and the second reference voltage VREF2 may each be a read voltage, an erase verify voltage, or a program verify voltage.

As the temperature decreases, a memory cell current also decreases, and thus, the memory cell distribution is shifted to the right. Therefore, when an internal and/or ambient temperature of the memory device 10 varies from 85° C. to 25° C., the first reference voltage VREF1 may not be an optimal voltage for distinguishing a memory cell distribution 50 from the memory cell distribution 60. Here, the temperature may be, for example, the temperature of the memory device 10. However, the technical spirit of the inventive concept is not limited to this case. For example, the temperature may be the temperature of a particular part of the memory device 10 or the temperature outside the memory device 10. In other words, in some cases, it is difficult to distinguish the memory cell distribution 50 from the memory cell distribution 60 by the first reference voltage VREF1 at 25° C. Therefore, the second reference voltage VREF2 corresponding to an optimal valley between the distributions is required. In this regard, a voltage corresponding to the optimal valley may be an optimal voltage applied to a selected word line in order to determine a turn-off state and turn-on state of memory cells connected to the selected word line and identify data stored in the corresponding memory cells.

In order to provide an optimal voltage, even when the ambient temperature varies from 85° ° C. to 25° ° C., in order to perform a read operation via a reference voltage corresponding to an optimal valley, the memory device 10 may convert the first reference voltage VREF1 applied to a selected word line into the second reference voltage VREF2 corresponding to the optimal valley according to a decrease in temperature to perform the read operation. Accordingly, the inventive concept may provide an optimal voltage for a read operation.

The reference voltage applied to the selected word line has been described in order to perform a read operation according to a change in temperature, but the inventive concept is not limited thereto, and may be applied to various types of voltages applied to a selected word line, a non-selected word line, and/or a bit line in order to perform program, read, and/or erase operations on the memory cell array 11.

Referring to FIG. 7, in operation S110, the memory device 10 may generate a compensation offset voltage via at least one amplifier, based on a first voltage that varies according to a change in temperature and a second voltage that does not vary according to a change in temperature.

In an embodiment, the voltage generator 14 may include a first voltage generator that generates a first voltage that varies according to a change in temperature, and a second voltage generator that generates a second voltage that does not vary according to a change in temperature, and the temperature compensation circuit 16 may generate a compensation offset voltage based on the first voltage applied from the first voltage generator and the second voltage applied from the second voltage generator. In other words, the temperature compensation circuit 16 may generate a compensation offset voltage based on the first voltage that varies according to a change in temperature and the second voltage that does not vary according to a change in temperature.

The first voltage that varies according to a change in temperature and the second voltage that does not vary according to a change in temperature are described in detail with reference to FIG. 9.

Figure 9:
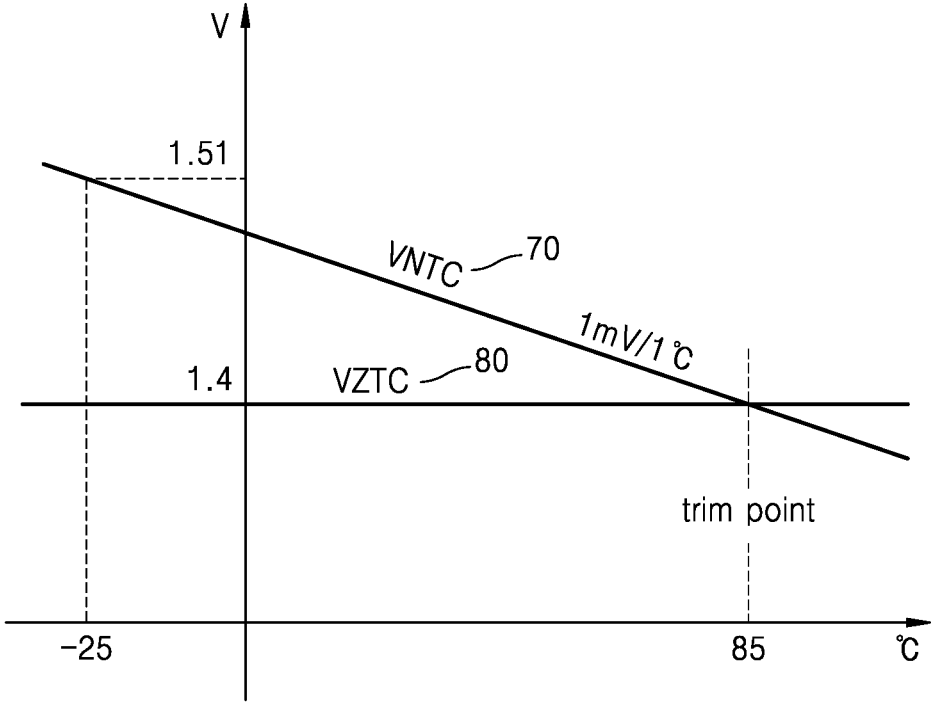
FIG. 9 is a diagram for explaining an operating method of a memory device, according to an embodiment.

FIG. 9 is a diagram for explaining an operating method of the memory device 10, according to an embodiment.

Referring to FIG. 9, a first voltage 70 that is generated by the first voltage generator and varies according to a change in temperature and a second voltage 80 that is generated by the second voltage generator and does not vary according to a change in temperature are shown according to a change in temperature. In this regard, the first voltage may be referred to as a voltage negative temperature coefficient (VNTC), and the second voltage may be referred to as a voltage zero temperature coefficient (VZTC).

Referring to FIG. 9, it may be seen that the level of the first voltage 70 linearly decreases as the temperature increases, and the level of the second voltage 80 is constant as the temperature increases or decreases.

In the inventive concept, the memory device 10 may reflect a compensation offset voltage according to temperature in various types of voltages applied to a selected word line, a non-selected word line, and/or a bit line in order to perform program, read, and/or erase operations on the memory cell array 11, based on the difference between the level of the first voltage VNTC that varies according to temperature and the level of the second voltage VZTC that is constant according to temperature.

It has been described that the level of the first voltage 70 linearly decreases as the temperature increases, but the inventive concept is not limited thereto, and the level of the first voltage 70 may linearly increases as the temperature increases.

Referring back to FIG. 7, in operation S110, the memory device 10 may generate a compensation offset voltage via at least one amplifier, based on the first voltage VNTC that varies according to a change in temperature and the second voltage VZTC that does not vary according to a change in temperature, and then, operation S120 may be performed.

In operation S120, the memory device 10 may generate the second reference voltage VREF2, based on the first reference voltage VREF1 applied to at least one line among a plurality of word lines and a plurality of bit lines, and a compensation offset voltage Voffset thus generated.

In an embodiment, the temperature compensation circuit 16 may be configured to generate the compensation offset voltage Voffset based on the difference between the level of the first voltage VNTC that varies according to a change in temperature and the level of the second voltage VZTC that does not vary according to a change in temperature, and output the second reference voltage VREF2 based on the sum of the level of the first reference voltage VREF1 applied to at least one line among a plurality of word lines and a plurality of bit lines and the level of the generated compensation offset voltage Voffset. In this regard, the second reference voltage VREF2 may be a voltage obtained by reflecting the compensation offset voltage Voffset according to temperature in the first reference voltage VREF1.

In addition, the level of the first voltage VNTC may linearly decrease as the temperature increases.

According to an embodiment, there is an effect of improving linearity of a temperature compensation operation by generating, via an amplifier, a compensation offset voltage according to the difference between the first voltage VNTC that varies according to a change in temperature and the second voltage VZTC that does not vary according to a change in temperature in order to compensate for temperature with respect to a reference voltage applied to word lines and/or bit lines.

Specifically, a current trim method of the related art uses a transistor for temperature compensation current generation for temperature compensation, and thus, a, which is a non-linear element, exists, whereas a resistance trim method of the inventive concept has an effect of improving linearity of a temperature compensation operation by generating a compensation offset voltage via an amplifier.

In addition, compared to temperature compensation as performed in the current trim method of the related art, temperature compensation as performed in the resistance trim method according to an embodiment has an effect of improving a memory cell distribution.

In addition, in the temperature compensation performed in the current trim method of the related art, a temperature compensation amount differs according to DC gain, whereas in the temperature compensation performed in the resistance trim method according to an embodiment, there is an effect of performing constant temperature compensation regardless of DC gain.

In addition, in the current trim method of the related art, the maximum compensation amount of a temperature compensation current may be 50 mA, whereas in the temperature compensation performed in the resistance trim method of the inventive concept, there is an effect of extending the maximum compensation amount of a temperature compensation voltage by adjusting only the magnitude of a resistance.

Figure 10:
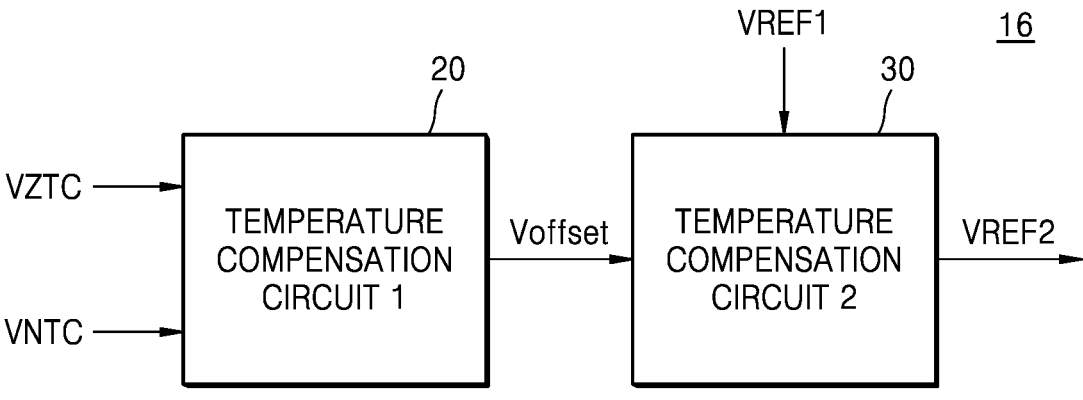
FIG. 10 is a block diagram of a temperature compensation circuit according to an embodiment.

FIG. 10 is a block diagram of the temperature compensation circuit 16 according to an embodiment.

Referring to FIG. 10, the temperature compensation circuit 16 may include a first temperature compensation circuit 25 and a second temperature compensation circuit 30.

The first temperature compensation circuit 25 may generate the compensation offset voltage Voffset based on the first voltage VNTC that varies according to a change in temperature and the second voltage VZTC that does not vary according to a change in temperature.

The second temperature compensation circuit 30 may generate the second reference voltage VREF2, based on the first reference voltage VREF1 applied to at least one line among a plurality of word lines and a plurality of bit lines, and the generated compensation offset voltage Voffset. In this regard, the second reference voltage VREF2 may be a voltage obtained by reflecting the compensation offset voltage Voffset according to temperature in the first reference voltage VREF1. Hereinafter, various embodiments of the temperature compensation circuit 16 are described.

Figure 11:
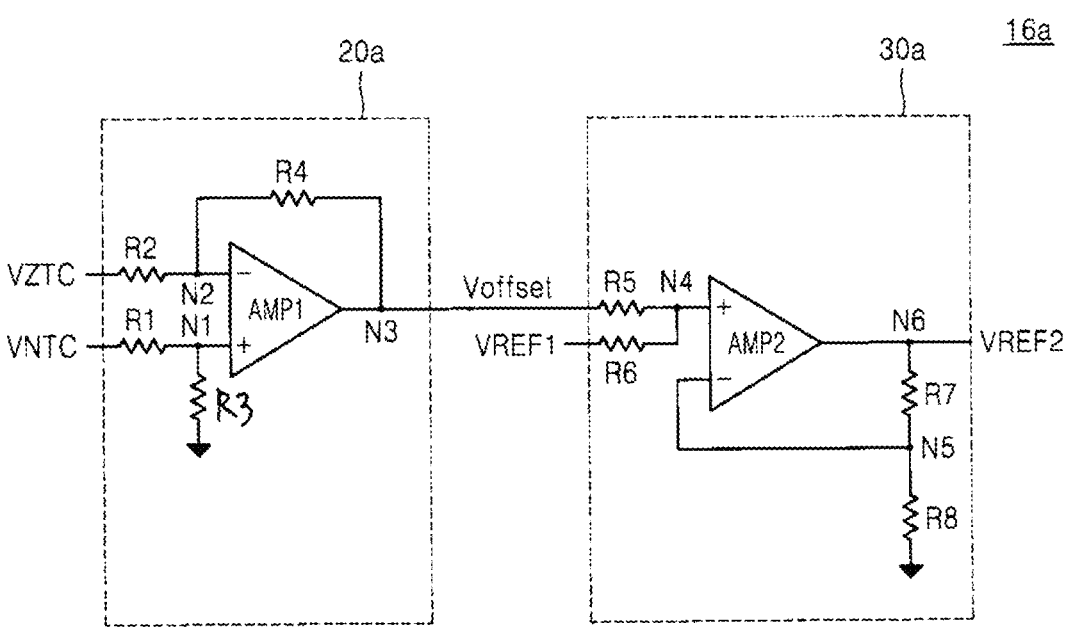
FIG. 11 is a circuit diagram of an equivalent circuit of a temperature compensation circuit, according to an embodiment.

FIG. 11 is a circuit diagram of an equivalent circuit of a temperature compensation circuit according to an embodiment.

Referring to FIG. 11, a temperature compensation circuit 16a may include a first temperature compensation circuit 20a corresponding to a differential amplifier and a second temperature compensation circuit 30a corresponding to a non-inverting summing amplifier.

The first temperature compensation circuit 20a corresponding to a differential amplifier may generate the compensation offset voltage Voffset based on the first voltage VNTC that varies according to a change in temperature and the second voltage VZTC that does not vary according to a change in temperature.

Referring to FIG. 11, the first temperature compensation circuit 20a may include a first resistor R1 connected between a terminal to which the first voltage VNTC that varies according to a change in temperature is applied and a first node N1, a second resistor R2 connected between a terminal to which the second voltage VZTC that does not vary according to a change in temperature is applied and a second node N2, a first amplifier AMP1 including input terminals respectively connected to the first node N1 and the second node N2 and an output terminal connected to a third node N3 to which the compensation offset voltage Voffset is applied, a third resistor R3 connected between the first node N1 and a ground (or, a ground node), and a fourth resistor R4 connected between the second node N2 and the third node N3.

The level of the compensation offset voltage Voffset generated by the first temperature compensation circuit 20a may be determined by the following Equation 1.

$$Voffset = \frac{R_3(R_2 + R_4)}{R_2(R_1 + R_3)} VNTC - \frac{R_4}{R_2} VZTC \qquad \text{[Equation 1]}$$

In this regard, R1 to R4 refer to the magnitude of the first resistor to the magnitude of the fourth resistor, respectively, and VNTC and VZTC refer to the first voltage and the second voltage, respectively.

In addition, when the magnitude of the first resistor R1 is the same as the magnitude of the second resistor R2 and the magnitude of the third resistor R3 is the same as the magnitude of the fourth resistor R4 are the same, the level of the compensation offset voltage Voffset generated by the first temperature compensation circuit 20a may be determined by the following Equation 2.

$$Voffset = \left(\frac{R_3}{R_1}\right)(VNTC - VZTC) \qquad \text{[Equation 2]}$$

The second temperature compensation circuit 30a corresponding to a non-inverting summing amplifier may generate the second reference voltage VREF2, based on the first reference voltage VREF1 applied to at least one line among a plurality of word lines and a plurality of bit lines, and the generated compensation offset voltage Voffset. In this regard, the second reference voltage VREF2 may be a voltage obtained by reflecting the compensation offset voltage Voffset according to temperature in the first reference voltage VREF1.

Referring to FIG. 11, the second temperature compensation circuit 30a may include a fifth resistor R5 connected between the third node N3 and a fourth node N4, a sixth resistor R6 connected between a terminal to which the first reference voltage VREF1 is applied and the fourth node N4, a second amplifier AMP2 including a first input terminal connected to the fourth node N4, a second input terminal connected to a fifth node N5 and an output terminal connected to a sixth node N6 to which the second reference voltage VREF2 is applied, a seventh resistor R7 connected between the fifth node N5 and the sixth node N6, and an eighth resistor R8 connected between the fifth node N5 and the ground.

The level of the second reference voltage VREF2 generated by the second temperature compensation circuit 30a may be determined by the following Equation 3.

$$VREF2 = \frac{R_7 + R_8}{R_8(R_5 + R_6)}(R_6 Voffset + R_5 VREF1) \qquad \text{[Equation 3]}$$

In this regard, R5 to R8 refer to the magnitude of the fifth resistor to the magnitude of the eighth resistor, respectively, and Voffset and VREF1 refer to the level of the compensation offset voltage and the level of the first reference voltage, respectively.

In addition, when the magnitude of the fifth resistor R5 is the same as the magnitude of the sixth resistor R6, the level of the second reference voltage VREF2 generated by the second temperature compensation circuit 30a may be determined by the following Equation 4.

$$VREF2 = \left(1 + \frac{R_7}{R_8}\right)\left(\frac{Voffset + VREF1}{2}\right) \qquad \text{[Equation 4]}$$

In an embodiment, the memory device 10 may generate a compensation offset voltage based on the difference between the level of the first voltage VNTC and the level of the second voltage VZTC by applying, to a differential amplifier, the first voltage VNTC that varies according to a change in temperature and the second voltage VZTC that does not vary according to a change in temperature. In addition, the memory device 10 may generate the second reference voltage VREF2 based on the sum of the level of the compensation offset voltage Voffset and the level of the first reference voltage VREF1 by applying, to a non-inverting summing amplifier, the generated compensation offset voltage Voffset and the first reference voltage VREF1 applied to at least one line among a plurality of word lines and a plurality of bit lines.

Figure 12:
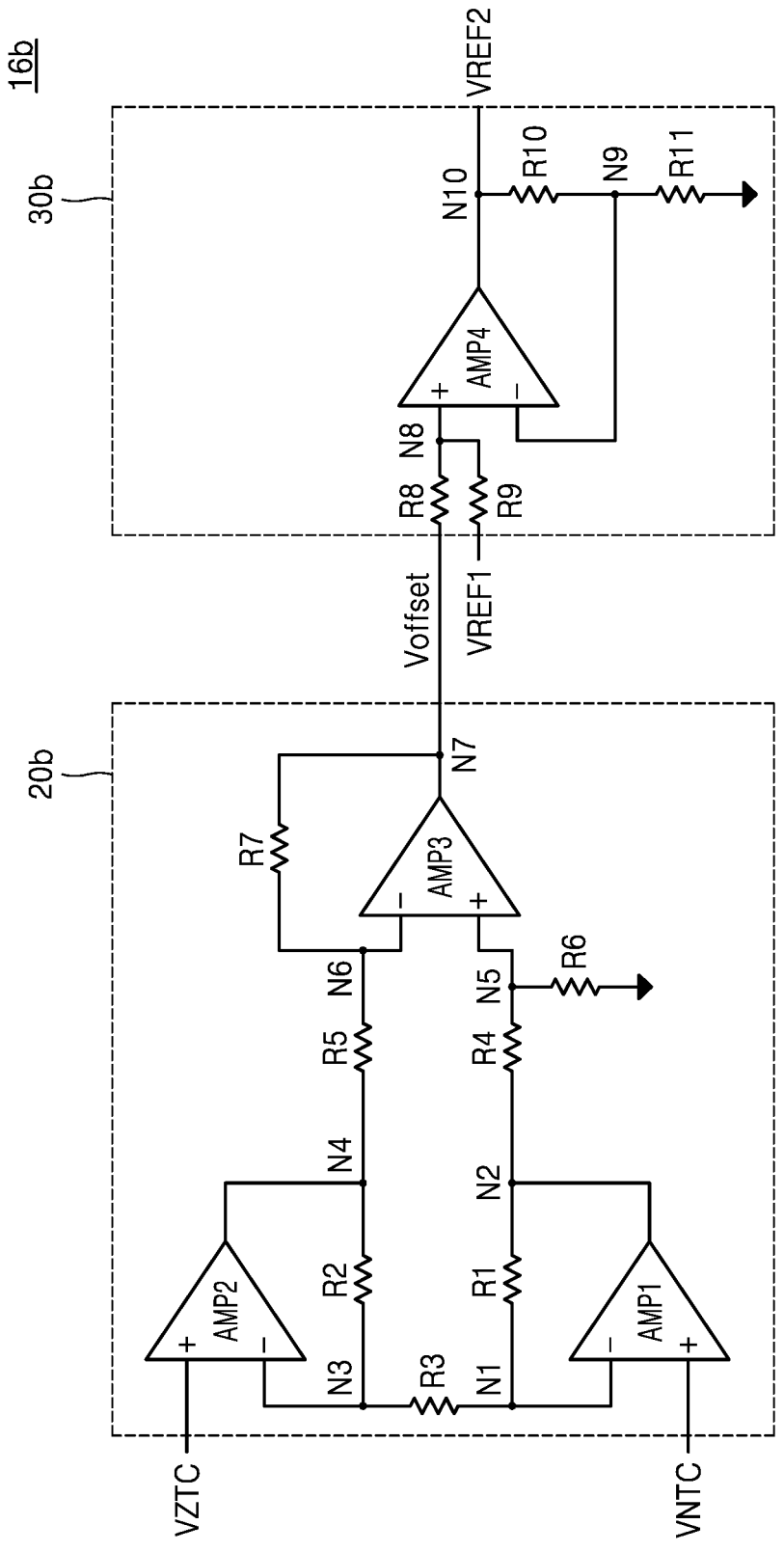
FIG. 12 is a circuit diagram of an equivalent circuit of a temperature compensation circuit, according to an embodiment.

FIG. 12 is a circuit diagram of an equivalent circuit of a temperature compensation circuit, according to an embodiment.

Referring to FIG. 12, a temperature compensation circuit 16b may include a first temperature compensation circuit 20b corresponding to a high-gain differential amplifier and a second temperature compensation circuit 30b corresponding to a non-inverting summing amplifier.

The first temperature compensation circuit 20b corresponding to a high-gain differential amplifier may generate the compensation offset voltage Voffset based on the first voltage VNTC that varies according to a change in temperature and the second voltage VZTC that does not vary according to a change in temperature.

Referring to FIG. 12, the first temperature compensation circuit 20b may include a first amplifier AMP1 including a first input terminal connected to a terminal to which the first voltage VNTC that varies according to a change in temperature is applied, a second input terminal connected to a first node N1 and an output terminal connected to a second node N2, a first resistor R1 connected between the first node N1 and the second node N2, a second amplifier AMP2 including a first input terminal connected to a terminal to which the second voltage VZTC that does not vary according to a change in temperature is applied, a second input terminal connected to a third node N3 and an output terminal connected to a fourth node N4, a second resistor R2 connected between the third node N3 and the fourth node N4, a third resistor R3 connected between the third node N3 and the first node N1, a fourth resistor R4 connected between the second node N2 and a fifth node N5, a fifth resistor R5 connected between the fourth node N4 and a sixth node N6, a third amplifier AMP3 including a first input terminal connected to the fifth node N5, a second input terminal connected to the sixth node N6 and an output terminal connected to a seventh node N7 to which the compensation offset voltage Voffset is applied, a sixth resistor R6 connected between the fifth node N5 and the ground, and a seventh resistor R7 connected between the sixth node N6 and the seventh node N7.

When the magnitude of the first resistor R1 is the same as the magnitude of the second resistor R2 and the magnitude of the sixth resistor R6 is the same as the magnitude of the seventh resistor R7, the level of the compensation offset voltage Voffset generated by the first temperature compensation circuit 20b may be determined by the following Equation 5.

$$Voffset = \left(1 + \frac{2R_1}{R_3}\right)\left(\frac{R_6}{R_4}\right)(VNTC - VZTC) \qquad \text{[Equation 5]}$$

In this regard, R1, R3, R4, and R5 refer to the magnitude of the first resistor, the magnitude of the third resistor, the magnitude of the fourth resistor, and the magnitude of the fifth resistor, respectively, and VNTC and VZTC refer to the first voltage and the second voltage, respectively.

The second temperature compensation circuit 30b corresponding to a non-inverting summing amplifier may generate the second reference voltage VREF2, based on the first reference voltage VREF1 applied to at least one line among a plurality of word lines and a plurality of bit lines, and the generated compensation offset voltage Voffset. In this regard, the second reference voltage VREF2 may be a voltage obtained by reflecting the compensation offset voltage Voffset according to temperature in the first reference voltage VREF1.

Referring to FIG. 12, the second temperature compensation circuit 30b may include an eighth resistor R8 connected between the seventh node N7 and an eighth node N8, a ninth resistor R9 connected between a terminal to which the first reference voltage VREF1 is applied and the eighth node N8, a fourth amplifier AMP4 including a first input terminal connected to the eighth node N8, a second input terminal connected to a ninth node N9 and an output terminal connected to a tenth node N10 to which the second reference voltage VREF2 is applied, a tenth resistor R10 connected between the ninth node N9 and the tenth node N10, and an eleventh resistor R11 connected between the ninth node N9 and the ground.

The level of the second reference voltage VREF2 generated by the second temperature compensation circuit 30b may be determined by the following Equation 6.

$$VREF2 = \frac{R_{10} + R_{11}}{R_{11}(R_8 + R_9)}(R_9\ Voffset + R_8\ VREF1) \qquad \text{[Equation 6]}$$

In this regard, R8 to R11 refer to the magnitude of the eighth resistor to the magnitude of the eleventh resistor, respectively, and Voffset and VREF1 refer to the level of the compensation offset voltage and the level of the first reference voltage, respectively.

In addition, when the magnitude of the eighth resistor R8 is the same as the magnitude of the ninth resistor R9, the level of the second reference voltage VREF2 generated by the second temperature compensation circuit 30b may be determined by the following Equation 7.

$$VREF2 = \left(1 + \frac{R_{10}}{R_{11}}\right)\left(\frac{Voffset + VREF1}{2}\right) \qquad \text{[Equation 7]}$$

In an embodiment, the memory device 10 may generate a compensation offset voltage based on the difference between the level of the first voltage and the level of the second voltage by applying, to a high-gain differential amplifier, the first voltage VNTC that varies according to a change in temperature and the second voltage VZTC that does not vary according to a change in temperature. In addition, the memory device 10 may generate the second reference voltage VREF2 by applying, to a non-inverting summing amplifier, the first reference voltage VREF1 applied to at least one line among a plurality of word lines and a plurality of bit lines, and the generated compensation offset voltage Voffset.

In addition, the memory device 10 may generate a compensation offset voltage such that the level of the compensation offset voltage becomes one of a negative level and a positive level.

In an embodiment, in response to the voltage control signal CTRL_vol of the control circuitry 13, the temperature compensation circuit 16 may generate a compensation offset voltage such that the level of the compensation offset voltage becomes one of a negative level and a positive level by physically switching a terminal to which the first voltage VNTC that varies according to a change in temperature is applied by the first voltage generator and a terminal to which the second voltage VZTC that does not vary according to a change in temperature is applied by the second voltage generator with each other.

In addition, the memory device 10 may, by varying the magnitude of at least one resistor included in the temperature compensation circuit 16, generate the compensation offset voltage Voffset based on the varied magnitude of the at least one resistor.

In an embodiment, in response to the voltage control signal CTRL_vol of the control circuitry 13, the temperature compensation circuit 16 may, by physically switching electrical connections to at least one resistor or logically varying the magnitude of at least one resistor, generate the compensation offset voltage Voffset based on the varied magnitude of the at least one resistor.

Figure 13:
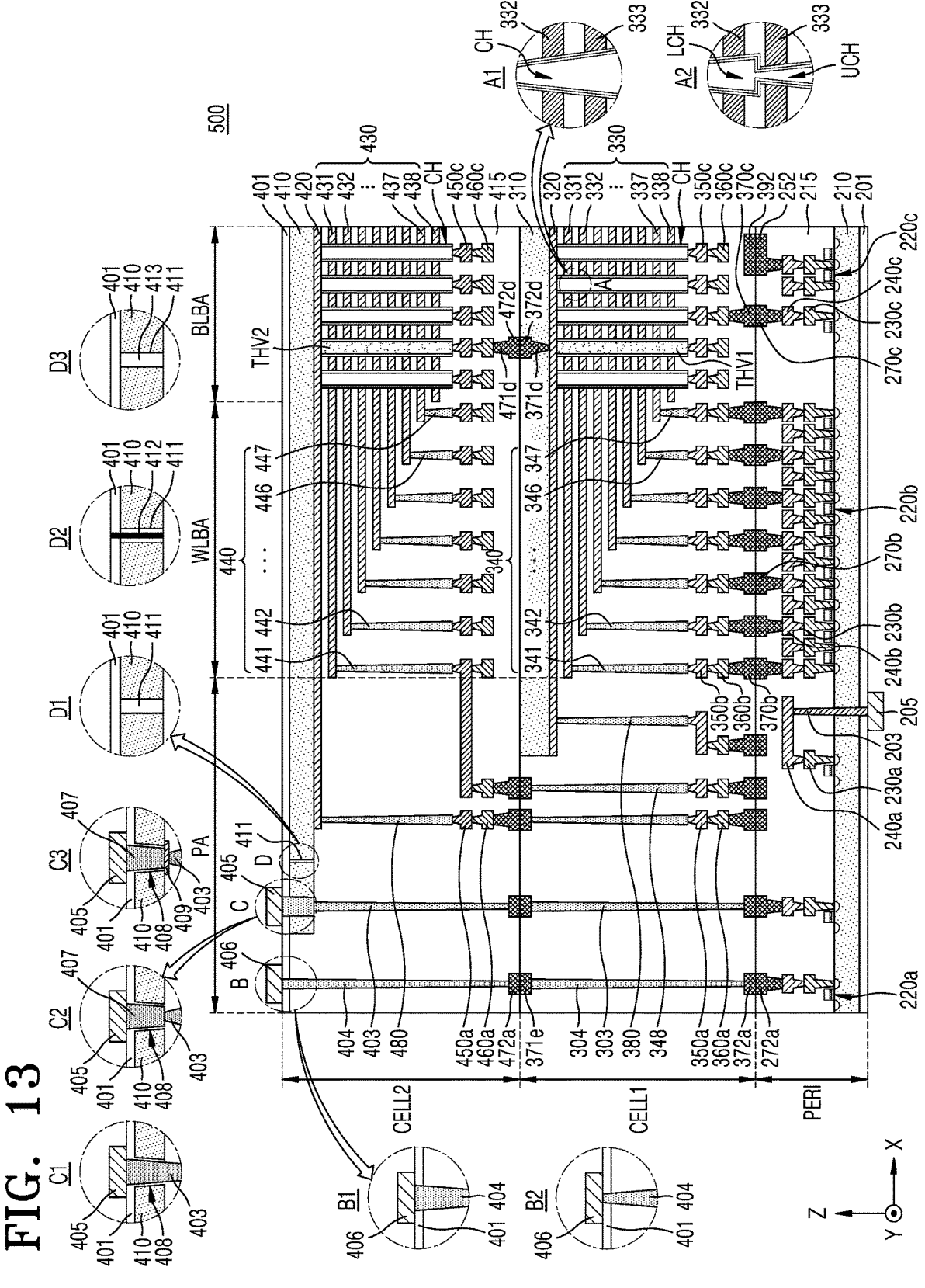
FIG. 13 is a cross-sectional view of a memory device having a B-VNAND structure, according to an embodiment.

FIG. 13 is a cross-sectional view of a memory device 500 having a B-VNAND (Bonding-Vertical NAND) structure, according to an embodiment.

Referring to FIG. 13, the memory device 500 may have a chip to chip (C2C) structure. In this regard, the C2C structure may mean that at least one upper chip including a cell region CELL and a lower chip including a peripheral circuit region PERI are each manufactured, and then, the at least one upper chip and the lower chip are connected to each other by a bonding method. As an example, the bonding method may mean a bonding metal pattern formed on an uppermost metal layer of an upper chip and a bonding metal pattern formed on an uppermost metal layer of a lower chip are electrically or physically connected to each other. For example, when the bonding metal patterns are formed of copper (Cu), the bonding method may be a Cu—Cu bonding method. As another example, the bonding metal patterns may also be formed of aluminum (Al) or tungsten (W).

The memory device 500 may include at least one upper chip including a cell region. For example, as shown in FIG. 13, the memory device 500 may be implemented to include two upper chips. However, this is only an example, and the number of upper chips is not limited thereto. When the memory device 500 is implemented to include two upper chips, the memory device 500 may be manufactured by manufacturing a first upper chip including a first cell region CELL1, a second upper chip including a second cell region CELL2, and a lower chip including the peripheral circuit region PERI, and then, connecting the first upper chip, the second upper chip, and the lower chip to each other by a bonding method. The first upper chip may be inverted and connected to the lower chip by a bonding method, and the second upper chip may also be inverted and connected to the first upper chip by a bonding method. In the following description, upper and lower portions of the first and second upper chips are defined for before the first upper chip and the second upper chip are inverted. In other words, in FIG. 13, an upper portion of the lower chip refers to an upper portion defined with respect to the +Z-axis direction, and an upper portion of each of the first and second upper chips refers to an upper portion defined with respect to the −Z-axis direction. However, this is only an example, and only one of the first upper chip and the second upper chip may be inverted and connected by a bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220a, 220b, and 220c formed on the first substrate 210. An interlayer insulating layer 215 including at least one insulating layer may be provided on the plurality of circuit elements 220a, 220b, and 220c, and a plurality of metal wirings connecting the plurality of circuit elements 220a, 220b, and 220c may be provided in the interlayer insulating layer 215. For example, the plurality of metal wirings may include first metal wirings 230a, 230b, and 230c respectively connected to the plurality of circuit elements 220a, 220b, and 220c, and second metal wirings 240a, 240b, and 240c respectively formed on the first metal wirings 230a, 230b, and 230c. The plurality of metal wirings may include at least one of various conductive materials. For example, the first metal wirings 230a, 230b, and 230c may be formed of tungsten having a relatively high electrical resistivity, and the second metal wirings 240*a*, 240*b*, and 240*c* may be formed of copper having a relatively low electrical resistivity.

Herein, only the first metal wirings 230*a*, 230*b*, and 230*c* and the second metal wirings 240*a*, 240*b*, and 240*c* are shown and explained, but the inventive concept is not limited thereto, and at least one additional metal wiring may be further formed on the second metal wirings 240*a*, 240*b*, and 240*c*. In this case, the second metal wirings 240*a*, 240*b*, and 240*c* may be formed of aluminum. In addition, at least some of additional metal wirings formed on the second metal wirings 240*a*, 240*b*, and 240*c* may be formed of copper having an electrical resistivity lower than that of aluminum of the second metal wirings 240*a*, 240*b*, and 240*c*.

The interlayer insulating layer 215 is arranged on the first substrate 210, and may include an insulating material such as silicon oxide and silicon nitride.

Each of the first and second cell regions CELL1 and CELL2 may include at least one memory block. The first cell region CELL1 may include a second substrate 310 and a common source line 320. A plurality of word lines 331 to 338 (i.e., 330) may be stacked on the second substrate 310 in a direction (Z-axis direction) perpendicular to an upper surface of the second substrate 310. String select lines and a ground select line may be arranged on upper and lower portions of the word lines 330, and the plurality of word lines 330 may be arranged between the string select lines and the ground select line. Likewise, the second cell region CELL2 includes a third substrate 410 and a common source line 420, and a plurality of word lines 431 to 438 (i.e., 430) may be stacked on the third substrate 410 in a direction (Z-axis direction) perpendicular to an upper surface of the third substrate 410. The second substrate 310 and the third substrate 410 may include various materials and may each be, for example, a silicon substrate, a silicon-germanium substrate, a germanium substrate, or a substrate having a monocrystalline epitaxial layer grown on a monocrystalline silicon substrate. A plurality of channel structures CH may be formed in each of the first and second cell regions CELL1 and CELL2.

In an embodiment, as shown in A1, each of the channel structures CH is provided in the bit line bonding region BLBA, and may extend in a direction perpendicular to the upper surface of the second substrate 310 and pass through the word lines 330, the string select lines, and the ground select line. The channel structure CH may include a data storage layer, a channel layer, and a buried insulating layer. The channel layer may be electrically connected to a first metal wiring 350*c* and a second metal wiring 360*c* in the bit line bonding region BLBA. For example, the second metal wiring 360*c* may be and be referred to as a bit line and may be connected to the channel structure CH via the first metal wiring 350*c*. The bit line 360*c* may extend in a first direction (Y-axis direction) parallel to the upper surface of the second substrate 310.

In an embodiment, as shown in A2, the channel structure CH may include a lower channel LCH and an upper channel UCH connected to each other. For example, the channel structure CH may be formed via a process for the lower channel LCH and a process for the upper channel UCH. The lower channel LCH may extend in a direction perpendicular to the upper surface of the second substrate 310 and pass through the common source line 320 and the lower word lines 331 and 332. The lower channel LCH may include a data storage layer, a channel layer, and a buried insulating layer and may be connected to the upper channel UCH. The upper channel UCH may pass through the upper word lines

333 to 338. The upper channel UCH may include a data storage layer, a channel layer, and a buried insulating layer, and the channel layer of the upper channel UCH may be electrically connected to the first metal wiring 350*c* and the second metal wiring 360*c*. As the length of a channel increases, it may be difficult to form a channel having a constant width due to process reasons. The memory device 500 according to an embodiment may include a channel having improved width uniformity via the lower channel LCH and the upper channel UCH formed in a sequential process.

As shown in A2, when the channel structure CH is formed to include the lower channel LCH and the upper channel UCH, a word line located near a boundary between the lower channel LCH and the upper channel UCH may be a dummy word line. For example, the word line 332 and the word line 333 forming the boundary between the lower channel LCH and the upper channel UCH may be dummy word lines. In this case, memory cells connected to the dummy word lines may not store data. Alternatively, the number of pages corresponding to memory cells connected to the dummy word lines may be less than the number of pages corresponding to memory cells connected to general word lines. The level of a voltage applied to the dummy word lines may differ from the level of a voltage applied to general dummy lines, thereby reducing an effect of a non-uniform channel width between the lower channel LCH and the upper channel UCH on the operation of the memory device.

In A2, the number of lower word lines 331 and 332 through which the lower channel LCH passes is less than the number of upper word lines 333 to 338 through which the upper channel UCH passes. However, this is only an example, and the inventive concept is not limited thereto. As another example, the number of lower word lines passing through the lower channel LCH may be equal to or greater than the number of upper word lines passing through the upper channel UCH. In addition, the structure and connection relationship of the channel structure CH arranged in the first cell region CELL1 as described above may be equally applied to the channel structure CH arranged in the second cell region CELL2.

In the bit line bonding region BLBA, a first through electrode THV1 may be provided in the first cell region CELL1 and a second through electrode THV2 may be provided in the second cell region CELL2. As shown in FIG. 13, the first through electrode THV1 may pass through the common source line 320 and the word lines 330. However, this is only an example, and the first through electrode THV1 may further pass through the second substrate 310. In an embodiment, the first through electrode THV1 may not pass through the common source line 320. The first through electrode THV1 may include a conductive material. Alternatively, the first through electrode THV1 may include a conductive material surrounded by an insulating material. The second through electrode THV2 may also be provided to have the same form and structure as those of the first through electrode THV1.

In an embodiment, the first through electrode THV1 and the second through electrode THV2 may be electrically connected to each other via a first through metal pattern 372*d* and a second through metal pattern 472*d*. The first through metal pattern 372*d* may be formed at a lower end of the first upper chip including the first cell region CELL1, and the second through metal pattern 472*d* may be formed at an upper end of the second upper chip including the second cell region CELL2. The first through electrode THV1 may be electrically connected to the first metal wiring 350c and the second metal wiring 360c. A lower via 371d may be formed between the first through electrode THV1 and the first through metal pattern 372d, and an upper via 471d may be formed between the second through electrode THV2 and the second through metal pattern 472d. The first through metal pattern 372d and the second through metal pattern 472d may be connected to each other by a bonding method.

In addition, in the bit line bonding region BLBA, an upper metal pattern 252 may be formed on an uppermost metal layer of the peripheral circuit region PERI, and an upper metal pattern 392 having the same shape as the upper metal pattern 252 may be formed on an uppermost metal layer of the first cell region CELL1. The upper metal pattern 392 of the first cell region CELL1 and the upper metal pattern 252 of the peripheral circuit region PERI may be electrically connected to each other by a bonding method. In the bit line bonding region BLBA, the bit line 360c may be electrically connected to a page buffer included in the peripheral circuit region PERI. For example, some of the circuit elements 220c of the peripheral circuit region PERI may provide a page buffer, and the bit line 360c may be electrically connected to the circuit elements 220c that provide a page buffer, via an upper bonding metal 370c of the first cell region CELL1 and an upper bonding metal 270c of the peripheral circuit region PERI.

Subsequently, referring to FIG. 13, in the word line bonding region WLBA, the word lines 330 of the first cell region CELL1 may extend in a second direction (X-axis direction) parallel to the upper surface of the second substrate 310, and may be connected to a plurality of cell contact plugs 341 to 347 (i.e., 340). A first metal wiring 350b and a second metal wiring 360b may be sequentially connected to upper portions of the cell contact plugs 340 connected to the word lines 330. The cell contact plugs 340 may be connected to the peripheral circuit region PERI via an upper bonding metal 370b of the first cell region CELL1 and an upper bonding metal 270b of the peripheral circuit region PERI, in the word line bonding region WLBA.

The cell contact plugs 340 may be electrically connected to a row decoder included in the peripheral circuit region PERI. For example, some of the circuit elements 220b of the peripheral circuit region PERI may provide a row decoder, and the cell contact plugs 340 may be electrically connected to the circuit elements 220b that provide the row decoder, via the upper bonding metal 370b of the first cell region CELL1 and the upper bonding metal 270b of the peripheral circuit region PERI. In an embodiment, an operating voltage of the circuit elements 220b that provide a row decoder may differ from an operating voltage of the circuit elements 220c that provide a page buffer. For example, an operating voltage of the circuit elements 220c that provide a page buffer may be greater than an operating voltage of the circuit elements 220b that provide a row decoder.

Likewise, in the word line bonding region WLBA, the word lines 430 of the second cell region CELL2 may extend in the second direction (X-axis direction) parallel to the upper surface of the third substrate 410, and may be connected to a plurality of cell contact plugs 441 to 447 and 440. The cell contact plugs 440 may be connected to the peripheral circuit region PERI via an upper metal pattern of the second cell region CELL2, lower and upper metal patterns of the first cell region CELL1, and a cell contact plug 348.

In the word line bonding region WLBA, the upper bonding metal 370b may be formed in the first cell region CELL1, and the upper bonding metal 270b may be formed in the peripheral circuit region PERI. The upper bonding metal 370b of the first cell region CELL1 and the upper bonding metal 270b of the peripheral circuit region PERI may be electrically connected to each other by a bonding method. The upper bonding metal 370b and the upper bonding metal 270b may be formed of aluminum, copper, or tungsten.

In the external pad bonding region PA, a lower metal pattern 371e may be formed on a lower portion of the first cell region CELL1, and an upper metal pattern 472a may be formed on an upper portion of the second cell region CELL2. The lower metal pattern 371e of the first cell region CELL1 and the upper metal pattern 472a of the second cell region CELL2 may be connected by a bonding method in the external pad bonding region PA. Likewise, an upper metal pattern 372a may be formed on an upper portion of the first cell region CELL1, and an upper metal pattern 272a may be formed on an upper portion of the peripheral circuit region PERI. The upper metal pattern 372a of the first cell region CELL1 and the upper metal pattern 272a of the peripheral circuit region PERI may be connected by a bonding method.

Common source line contact plugs 380 and 480 may be arranged in the external pad bonding region PA. The common source line contact plugs 380 and 480 may be formed of a conductive material such as a metal, a metal compound, or doped polysilicon. The common source line contact plug 380 of the first cell region CELL1 may be electrically connected to the common source line 320, and the common source line contact plug 480 of the second cell region CELL2 may be electrically connected to the common source line 420. A first metal wiring 350a and a second metal wiring 360a may be sequentially stacked on the common source line contact plug 380 of the first cell region CELL1, and a first metal wiring 450a and a second metal wiring 460a may be sequentially stacked on the common source line contact plug 480 of the second cell region CELL2.

First to third input/output pads 205, 405, and 406 may be arranged in the external pad bonding region PA. Referring to FIG. 13, a lower insulating film 201 may cover a lower surface of the first substrate 210, and the first input/output pad 205 may be formed on the lower insulating film 201. The first input/output pad 205 is connected to at least one of the circuit elements 220a arranged in the peripheral circuit region PERI, via a first input/output contact plug 203, and may be separated from the first substrate 210 by the lower insulating film 201. In addition, a side insulating film may be arranged between the first input/output contact plug 203 and the first substrate 210 to electrically separate the first input/output contact plug 203 from the first substrate 210.

An upper insulating film 401 that covers an upper surface of the third substrate 410 may be formed over the third substrate 410. The second input/output pad 405 and/or the third input/output pad 406 may be arranged on the upper insulating film 401. The second input/output pad 405 may be connected to at least one of the circuit elements 220a arranged in the peripheral circuit region PERI, via second input/output contact plugs 403 and 303, and the third input/output pad 406 may be connected to at least one of the circuit elements 220a arranged in the peripheral circuit region PERI via third input/output contact plugs 404 and 304.

In an embodiment, the third substrate 410 may not be arranged in a region in which the input/output contact plug is arranged. For example, as shown in B, the third input/output contact plug 404 is separated from the third substrate 410 in a direction parallel to the upper surface of the third substrate 410, and may be connected to the third input/output pad 406 through an interlayer insulating layer 415 of the second cell region CELL2. In this case, the third input/output contact plug 404 may be formed via various processes.

For example, as shown in B1, the third input/output contact plug 404 extends in a third direction (Z-axis direction), and may be formed to have a diameter that increases toward the upper insulating film 401. In other words, the diameter of the channel structure CH described in A1 is formed to decrease toward the upper insulating film 401, whereas the diameter of the third input/output contact plug 404 may be formed to increase toward the upper insulating film 401. For example, the third input/output contact plug 404 may be formed after the second cell region CELL2 and the first cell region CELL1 are bonded together.

In addition, for example, as shown in B2, the third input/output contact plug 404 extends in the third direction (Z-axis direction), and may be formed to have a diameter that decreases toward the upper insulating film 401. In other words, as with the channel structure CH, the diameter of the third input/output contact plug 404 may be formed to decrease toward the upper insulating film 401. For example, the third input/output contact plug 404 may be formed together with the cell contact plugs 440 before the second cell region CELL2 and the first cell region CELL1 are bonded together.

In another embodiment, the input/output contact plug may be arranged to overlap the third substrate 410. For example, as shown in C, the second input/output contact plug 403 is formed to pass through the interlayer insulating layer 415 of the second cell region CELL2 in the third direction (Z-axis direction), and may be electrically connected to the second input/output pad 405 via the third substrate 410. In this case, a connection structure between the second input/output contact plug 403 and the second input/output pad 405 may be implemented in various manners.

For example, as shown in C1, an opening 408 passing through the third substrate 410 is formed, and the second input/output contact plug 403 may be directly connected to the second input/output pad 405 via the opening 408 formed in the third substrate 410. In this case, as shown in C1, the diameter of the second input/output contact plug 403 may be formed to increase toward the second input/output pad 405. However, this is only an example, and the diameter of the second input/output contact plug 403 may be formed to decrease toward the second input/output pad 405.

For example, as shown in C2, the opening 408 passing through the third substrate 410 is formed, and a contact 407 may be formed in the opening 408. One end portion of the contact 407 may be connected to the second input/output pad 405, and the other end portion may be connected to the second input/output contact plug 403. Accordingly, the second input/output contact plug 403 may be electrically connected to the second input/output pad 405 via the contact 407 within the opening 408. In this case, as shown in C2, the diameter of the contact 407 may be formed to increase toward the second input/output pad 405, and the diameter of the second input/output contact plug 403 may be formed to decrease toward the second input/output pad 405. For example, the second input/output contact plug 403 may be formed together with the cell contact plugs 440 before the second cell region CELL2 and the first cell region CELL1 are bonded together, and the contact 407 may be formed after the second cell region CELL2 and the first cell region CELL1 are bonded together.

In addition, for example, as shown in C3, compared to C2, a stopper 409 may be further formed on an upper surface of the opening 408 of the third substrate 410. The stopper 409 may be a metal wiring formed on the same layer as the common source line 420. However, this is only an example, and the stopper 409 may be a metal wiring formed on the same layer as at least one of the word lines 430. The second input/output contact plug 403 may be electrically connected to the second input/output pad 405 via the contact 407 and the stopper 409.

Meanwhile, similar to the second and third input/output contact plugs 403 and 404 of the second cell region CELL2, each of the second and third input/output contact plugs 303 and 304 of the first cell region CELL1 may be formed to have a diameter that decreases toward the lower metal pattern 371e or increases toward the lower metal pattern 371e.

Meanwhile, according to embodiments, a slit 411 may be formed in the third substrate 410. For example, the slit 411 may be formed at an arbitrary position of the external pad bonding region PA. For example, as shown in D, the slit 411 may be located between the second input/output pad 405 and the cell contact plugs 440, in a plan view. However, this is only an example, and in a plan view, the slit 411 may be formed such that the second input/output pad 405 is located between the slit 411 and the cell contact plugs 440.

For example, as shown in D1, the slit 411 may be formed to pass through the third substrate 410. The slit 411 may be used, for example, to prevent micro-cracking of the third substrate 410 when the opening 408 is formed. However, this is only an example, and the slit 411 may be formed to a depth of about 60-70% with respect to the thickness of the third substrate 410.

In addition, for example, as shown in D2, a conductive material 412 may be formed in the slit 411. The conductive material 412 may be used, for example, to discharge leakage current generated during driving of circuit elements within the external pad bonding region PA to the outside. In this case, the conductive material 412 may be connected to an external ground line.

In addition, for example, as shown in D3, an insulating material 413 may be formed in the slit 411. The insulating material 413 may be formed, for example, to electrically separate the second input/output pad 405 and the second input/output contact plug 403, which are arranged in the external pad bonding region PA, from the word line bonding region WLBA. By forming the insulating material 413 in the slit 411, a voltage provided via the second input/output pad 405 may be blocked from affecting a metal layer arranged on the third substrate 410 in the word line bonding region WLBA.

Meanwhile, according to embodiments, the first to third input/output pads 205, 405, and 406 may be selectively formed. For example, the memory device 500 may be implemented to include only the first input/output pad 205 arranged over the first substrate 210, or include only the second input/output pad 405 arranged over the third substrate 410, or include only the third input/output pad 406 arranged over the upper insulating film 401.

Meanwhile, according to embodiments, at least one of the second substrate 310 of the first cell region CELL1 and the third substrate 410 of the second cell region CELL2 may be used as a sacrificial substrate, and may be completely or partially removed before or after a bonding process. Additional films may be stacked after the removal of the substrate. For example, the second substrate 310 of the first cell region CELL1 may be removed before or after bonding of the peripheral circuit region PERI and the first cell region CELL1, and an insulating film that covers an upper surface of the common source line 320 or a conductive film for connection may be formed. Similarly, the third substrate 410 of the second cell region CELL2 may be removed before or after bonding of the first cell region CELL1 and the second cell region CELL2, and the upper insulating film 401 that covers an upper surface of the common source line 420 or a conductive film for connection may be formed.

Figure 14:
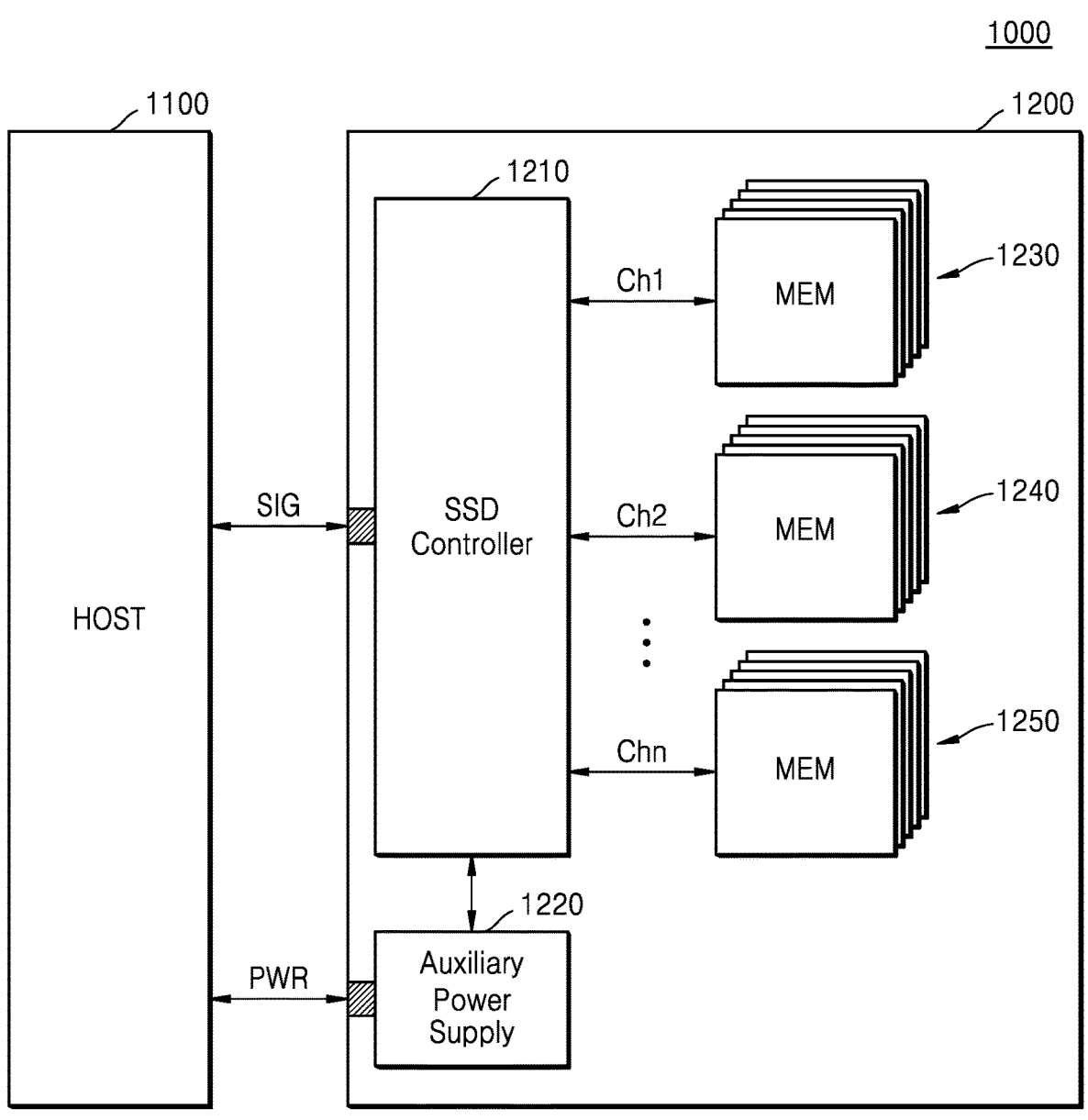
FIG. 14 is a block diagram of an SSD system according to an embodiment.

FIG. 14 is a block diagram of an SSD system 1000 according to an embodiment.

Referring to FIG. 14, the SSD system 1000 may include a host 1100 and an SSD 1200. The SSD 1200 may transmit/receive a signal to/from the host 1100 via a signal connector, and may receive an input of power via a power connector. The SSD 1200 may include an SSD controller 1210, an auxiliary power supply 1220, and memory devices (MEM) 1230, 1240, and 1250. In some embodiments, each of the memory devices 1230, 1240, and 1250 may be vertically stacked NAND flash memory devices. In this case, the SSD 1200 may be implemented by using the above-described embodiments with reference to FIGS. 1 to 13. Specifically, each memory device of the memory devices 1230, 1240, and 1250 may be implemented using the embodiments described above with reference to FIGS. 1 to 13. Accordingly, each of the memory devices 1230, 1240, and 1250 may perform a temperature compensation operation on a reference voltage.

While the inventive concept has been particularly shown and described with reference to embodiments thereof, it will be understood that various changes in form and details may be made therein without departing from the spirit and scope of the following claims.

What is claimed is:

1. A memory device comprising:
a memory cell array including a plurality of memory cells connected to a plurality of word lines and a plurality of bit lines;
a voltage generator configured to output a first voltage that varies according to a temperature of the memory device, a second voltage that is constant regardless of the temperature, and a first reference voltage applied to at least one line among the plurality of word lines and the plurality of bit lines; and
a temperature compensation circuit including at least one resistor and configured to generate a compensation offset voltage via a first amplifier based on the first voltage and the second voltage, and output a second reference voltage via a second amplifier based on the first reference voltage and the compensation offset voltage,
wherein the second amplifier includes a first input terminal to which a voltage generated by summing the first reference voltage and the compensation offset voltage is input, a second input terminal to which a voltage generated based on the second reference voltage is input, and an output terminal from which the second reference voltage is output.

2. The memory device of claim 1, wherein the temperature compensation circuit comprises a first temperature compensation circuit and a second temperature compensation circuit,
wherein the first temperature compensation circuit comprises:
a first resistor connected between a terminal to which the first voltage is applied and a first node;
a second resistor connected between a terminal to which the second voltage is applied and a second node;
a third resistor connected between the first node and a ground; and a fourth resistor connected between the second node and a third node, and
wherein the first amplifier includes input terminals respectively connected to the first node and the second node, and an output terminal connected to the third node from which the compensation offset voltage is output.

3. The memory device of claim 2, wherein the second temperature compensation circuit comprises:
a fifth resistor connected between the third node and a fourth node;
a sixth resistor connected between a terminal to which the first reference voltage is applied and the fourth node;
a seventh resistor connected between a fifth node and a sixth node; and
an eighth resistor connected between the fifth node and the ground, and
wherein the first input terminal of the second amplifier is connected to the fourth node, the second input terminal of the second amplifier is connected to the fifth node, and the output terminal of the second amplifier is connected to the sixth node.

4. The memory device of claim 1, wherein the temperature compensation circuit comprises a first temperature compensation circuit and a second temperature compensation circuit,
wherein the first temperature compensation circuit comprises:
a third amplifier including a first input terminal connected to a terminal to which the first voltage is applied, a second input terminal connected to a first node, and an output terminal connected to a second node;
a first resistor connected between the first node and the second node;
a fourth amplifier including a first input terminal connected to a terminal to which the second voltage is applied, a second input terminal connected to a third node, and an output terminal connected to a fourth node;
a second resistor connected between the third node and the fourth node;
a third resistor connected between the third node and the first node;
a fourth resistor connected between the second node and a fifth node;
a fifth resistor connected between the fourth node and a sixth node;
a sixth resistor connected between the fifth node and a ground; and
a seventh resistor connected between the sixth node and a seventh node, and
wherein the first input terminal of the first amplifier is connected to the fifth node, the second input terminal of the first amplifier is connected to the sixth node, and the output terminal of the first amplifier is connected to the seventh node from which the compensation offset voltage is output.

5. The memory device of claim 4, wherein the second temperature compensation circuit comprises:
an eighth resistor connected between the seventh node and an eighth node;
a ninth resistor connected between a terminal to which the first reference voltage is applied and the eighth node;
a tenth resistor connected between a ninth node and a tenth node; and
an eleventh resistor connected between the ninth node and the ground, and

wherein the first input terminal of the second amplifier is connected to the eighth node, the second input terminal of the second amplifier is connected to the ninth node, and the output terminal of the second amplifier is connected to the tenth node from which the second reference voltage is output.

6. The memory device of claim 1, wherein a level of the first voltage linearly decreases as the temperature increases.

7. The memory device of claim 1, wherein the temperature compensation circuit is configured to generate the compensation offset voltage such that a level of the compensation offset voltage becomes one of a negative level and a positive level, by physically switching a terminal that applies the first voltage and a terminal that applies the second voltage.

8. The memory device of claim 1, wherein the temperature compensation circuit is configured to generate, by varying a magnitude of the at least one resistor included in the temperature compensation circuit, the compensation offset voltage based on the varied magnitude of the at least one resistor.

9. An operating method of a memory device including a plurality of memory cells connected to a plurality of word lines and a plurality of bit lines, the method comprising:
generating a compensation offset voltage via a first amplifier based on a first voltage that varies according to a change in temperature and a second voltage that does not vary according to a change in temperature; and
generating a second reference voltage via a second amplifier based on the compensation offset voltage and a first reference voltage applied to at least one line among the plurality of word lines and the plurality of bit lines,
wherein the generating of the second reference voltage includes:
applying a voltage generated by summing the first reference voltage and the compensation offset voltage to the same input terminal of the second amplifier; and
outputting the second reference voltage from an output terminal of the second amplifier.

10. The operating method of claim 9, wherein the generating of the compensation offset voltage comprises:
generating the compensation offset voltage from the first amplifier based on a difference between a level of the first voltage and a level of the second voltage by applying the first voltage and the second voltage to the first amplifier.

11. The operating method of claim 9, wherein a level of the first voltage linearly decreases as the temperature increases.

12. The operating method of claim 9, wherein the generating of the compensation offset voltage comprises:
generating the compensation offset voltage from a temperature compensation circuit based on, by varying a magnitude of at least one resistor included in the temperature compensation circuit, the varied magnitude of the at least one resistor.

13. A memory system comprising:
a memory device including a plurality of memory cells connected to a plurality of word lines and a plurality of bit lines; and
a memory controller configured to output a command to control the memory device,
wherein the memory device further includes:
a temperature compensation circuit configured to generate a compensation offset voltage according to a change in temperature of the memory device via a first amplifier and adjust a level of a reference voltage applied to at least one line among the plurality of word lines and the plurality of bit lines,
wherein the memory device is configured to respond to the command to allow the temperature compensation circuit:
to generate the compensation offset voltage via the first amplifier based on a first voltage that varies according to a change in temperature of the memory device and a second voltage that does not vary according to a change in temperature of the memory device, and
to output a second reference voltage via a second amplifier based on the compensation offset voltage and a first reference voltage applied to at least one line among the plurality of word lines and the plurality of bit lines, and
wherein the second amplifier includes a first input terminal to which a voltage generated by summing the first reference voltage and the compensation offset voltage is input, a second input terminal to which a voltage generated based on the second reference voltage is input, and an output terminal from which the second reference voltage is output.

14. The memory system of claim 13, wherein the temperature compensation circuit comprises a first temperature compensation circuit and a second temperature compensation circuit,
wherein the first temperature compensation circuit comprises:
a first resistor connected between a terminal to which the first voltage is applied and a first node;
a second resistor connected between a terminal to which the second voltage is applied and a second node;
a third resistor connected between the first node and a ground; and
a fourth resistor connected between the second node and a third node, and
wherein the first amplifier includes input terminals respectively connected to the first node and the second node, and an output terminal connected to the third node from which the compensation offset voltage is output.

15. The memory system of claim 14, wherein the second temperature compensation circuit comprises:
a fifth resistor connected between the third node and a fourth node;
a sixth resistor connected between a terminal to which the first reference voltage is applied and the fourth node;
a seventh resistor connected between a fifth node and a sixth node; and
an eighth resistor connected between the fifth node and the ground, and
wherein the first input terminal of the second amplifier is connected to the fourth node, the second input terminal of the second amplifier is connected to the fifth node, and the output terminal of the second amplifier is connected to the sixth node.

16. The memory system of claim 13, wherein the temperature compensation circuit comprises a first temperature compensation circuit and a second temperature compensation circuit,
wherein the first temperature compensation circuit comprises:
a third amplifier including a first input terminal connected to a terminal to which the first voltage is applied, a second input terminal connected to a first node, and an output terminal connected to a second node;
a first resistor connected between the first node and the second node;

a fourth amplifier including a first input terminal connected to a terminal to which the second voltage is applied, a second input terminal connected to a third node, and an output terminal connected to a fourth node;

a second resistor connected between the third node and the fourth node;

a third resistor connected between the third node and the first node;

a fourth resistor connected between the second node and a fifth node;

a fifth resistor connected between the fourth node and a sixth node;

a sixth resistor connected between the fifth node and a ground; and a seventh resistor connected between the sixth node and a seventh node, and wherein the first input terminal of the first amplifier is connected to the fifth node, the second input terminal of the first amplifier is connected to the sixth node, and the output terminal of the first amplifier is connected to the seventh node from which the compensation offset voltage is output.

17. The memory system of claim 16, wherein the second temperature compensation circuit comprises:

an eighth resistor connected between the seventh node and an eighth node;

a ninth resistor connected between a terminal to which the first reference voltage is applied and the eighth node;

a tenth resistor connected between a ninth node and a tenth node; and an eleventh resistor connected between the ninth node and the ground, and wherein the first input terminal of the second amplifier is connected to the eighth node, the second input terminal of the second amplifier is connected to the ninth node, and the output terminal of the second amplifier is connected to the tenth node from which the second reference voltage is output.

\* \* \* \* \*